(12) United States Patent
Masuda et al.

(10) Patent No.: US 7,242,265 B2
(45) Date of Patent: Jul. 10, 2007

(54) ELEMENT OF PARALLEL FLAT PLATE LINE TYPE, A CIRCUIT BOARD

(75) Inventors: Koichiro Masuda, Tokyo (JP); Hirokazu Tohya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/320,594

(22) Filed: Dec. 30, 2005

(65) Prior Publication Data

US 2006/0114076 A1    Jun. 1, 2006

(51) Int. Cl.
*H01P 3/08* (2006.01)
*H04B 3/28* (2006.01)

(52) U.S. Cl. .................... 333/12; 333/156; 333/161
(58) Field of Classification Search .............. 333/12, 333/161, 156
See application file for complete search history.

(56) References Cited

U.S. PATENT DOCUMENTS 3,504,222 A * 3/1970 Fukushima .................. 315/3
3,736,534 A * 5/1973 Chaffee ....................... 333/161
4,465,988 A * 8/1984 Moats ......................... 333/156

FOREIGN PATENT DOCUMENTS

| EP | 0 653 838 A1 | 5/1995 |
|----|--------------|--------|
| JP | 3-35516 A    | 2/1991 |
| JP | 4-56445 B2   | 9/1992 |
| JP | 6-53046 A    | 2/1994 |
| JP | 7-202134 A   | 8/1995 |

\* cited by examiner

*Primary Examiner*—Robert Pascal
*Assistant Examiner*—Kimberly E Glenn
(74) *Attorney, Agent, or Firm*—Sughrue Mion, PLLC

(57) ABSTRACT

An element of parallel flat plate line type suitable for operation at a higher speed and with a higher frequency is provided. The element is characterized by including a first metallic member 1 including a flat plate section 11 and a projected section 12 in which a plurality of projections are formed to stand on one surface of the flat plate section 11 in a direction substantially vertical to the surface with gaps therebetween, a second metallic member 2 including a flat plate section 21 and a projected section 22 in which a plurality of projections are formed to stand on one surface of the flat plate section 21 in a direction substantially vertical to the surface with gaps therebetween, and a dielectric film 31 formed between the projections and the gaps of the element of parallel flat plate line type formed by inserting the projections of the first metallic member 1 in the gap of the second metallic member 2 and inserting the projections of the second metallic member 2 in the gap of the first metallic member 1, wherein a transmission line is formed between the first metallic member 1 and the second metallic member 2 along the dielectric film 31, the transmission line being formed to have transmittivity ranging from −140 dB to −20 dB for a high-frequency electromagnetic wave ranging from 100 kHz to 10 GHz supplied from one terminal.

13 Claims, 17 Drawing Sheets

FIG. 11
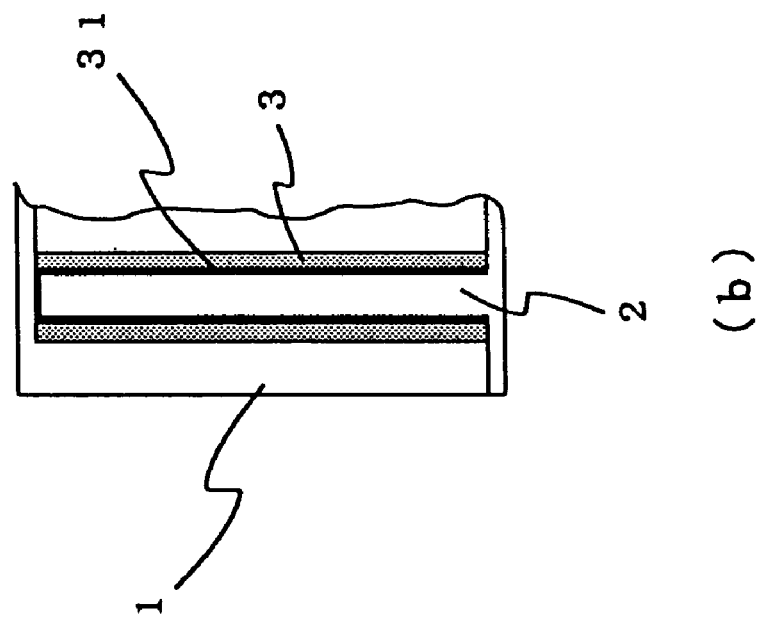
(b)
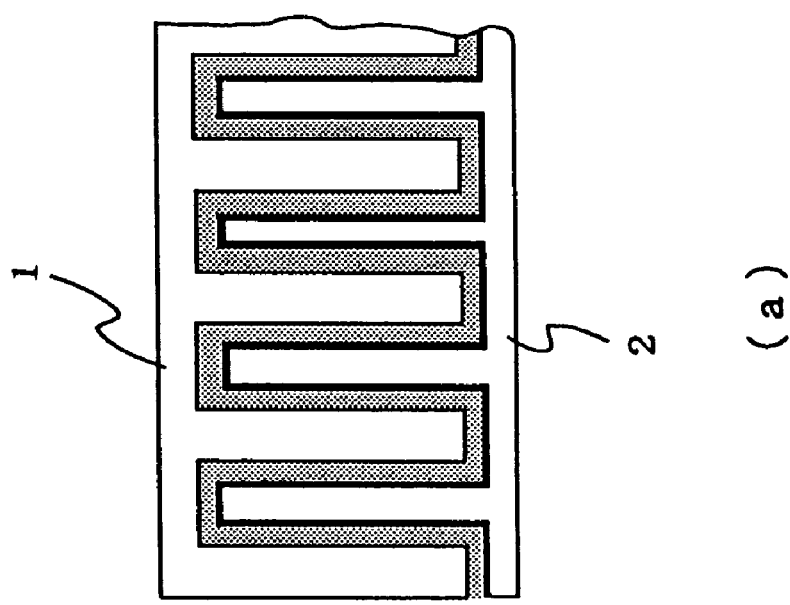
(a)

FIG.13
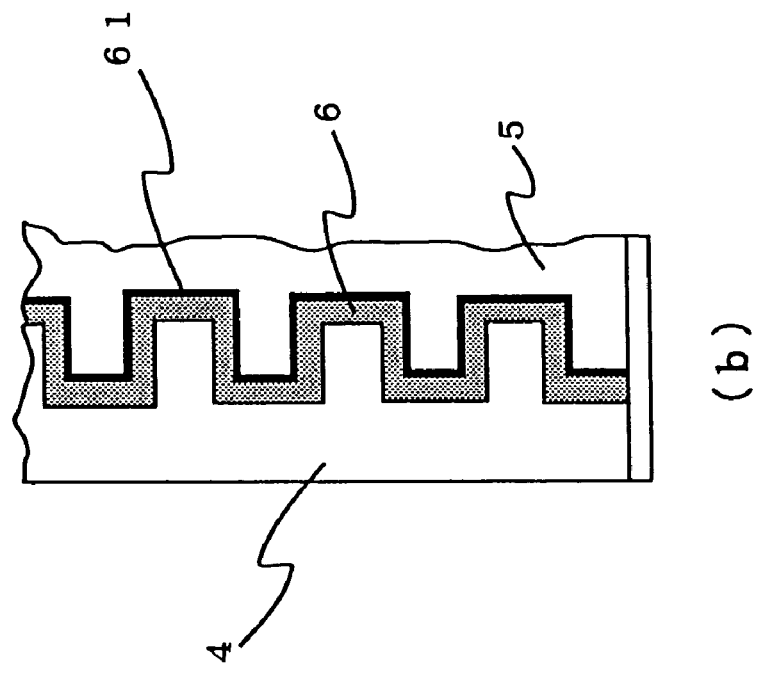
(a)
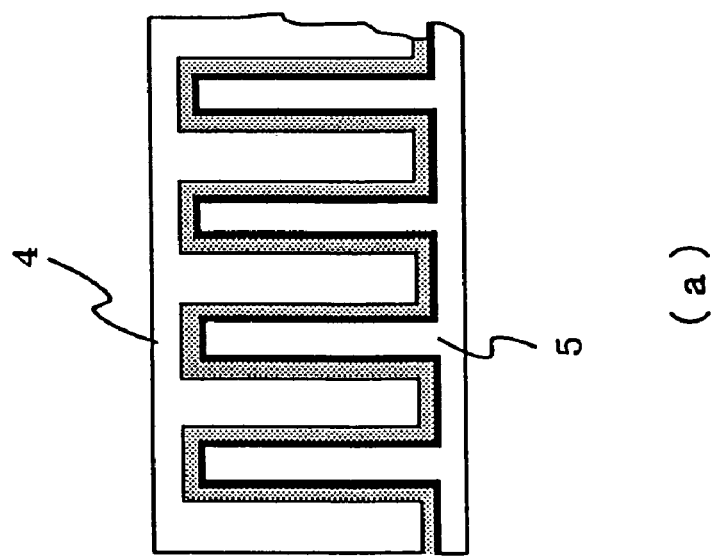
(b)

FIG. 15
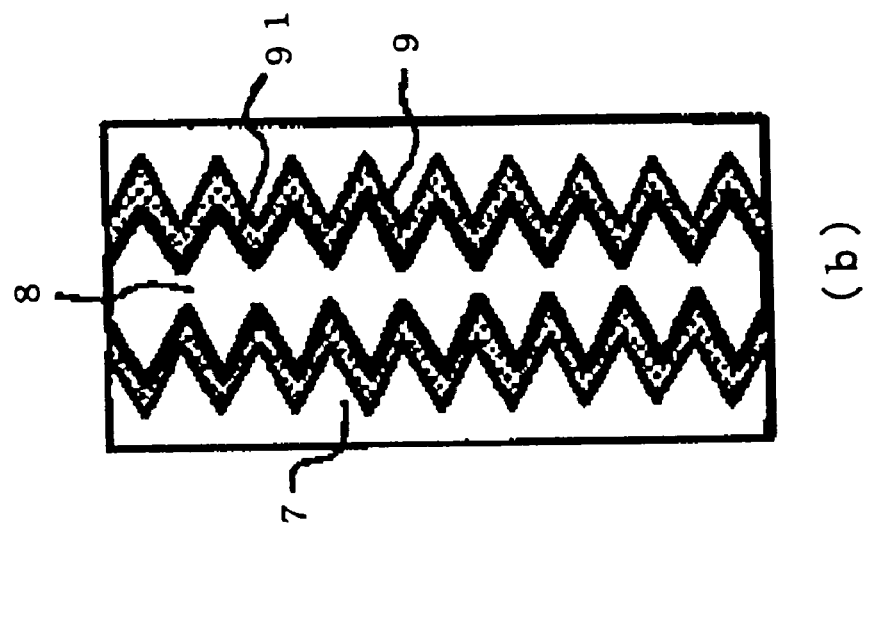
(b)
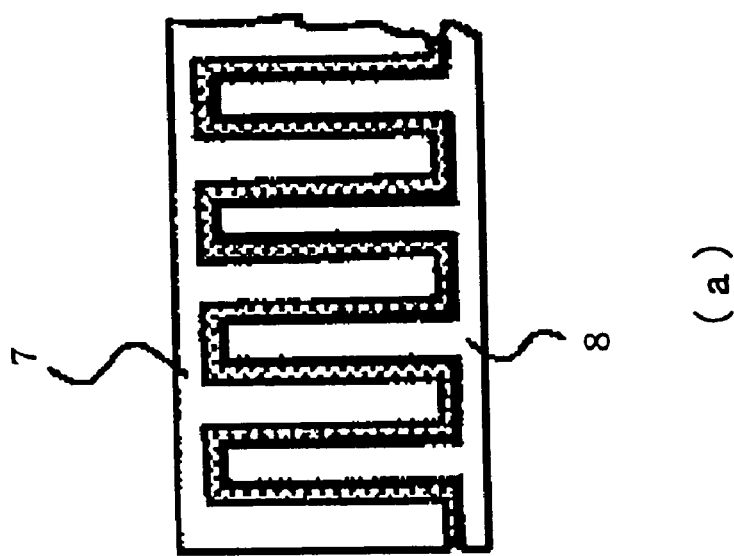
(a)

ELEMENT OF PARALLEL FLAT PLATE LINE TYPE, A CIRCUIT BOARD

TECHNICAL FIELD

The present invention relates to an element of line type to be mounted on an electronic circuit board, and in particular, to an element of line type which is suitable for a higher speed and a higher frequency and which is employed particularly as a bypass element for a noise filter and a power source decoupling element.

RELATED ART

With advance of technology, demands exist for reduction in size and for increase in performance of electronic devices. These requirements are satisfied, for example, for a switching power source and parts of digital signal processing circuits by setting a clock frequency to a higher value. However, this results in increase in a high-frequency current in circuits, particularly, in a power source circuit, and it hence becomes conspicuous that the electromagnetic radiation is increased and the signal quality is reduced. Therefore, the demand for higher performance of power source decoupling elements becomes increasingly severer.

Since a high-performance digital device includes high-speed circuits operating at a high speed and low-speed circuits operating at a low speed, a spectrum of electromagnetic waves leaking into a power distributor circuit has a distribution of a quite wide band ranging from several hundreds of kiloherz (kHz) to several tens of gigaherz (Ghz) in recent years. Additionally, in a relatively large semiconductor integrated circuit mounted on a board, a current from a direct-current (dc) power source is at a high level exceeding several tens of ampere. Specifically, the power distributor circuit is a circuit including a power source circuit and power source distributing wiring to supply power supplied from the power source circuit to other circuits as shown in FIG. 1.

A leakage electromagnetic wave propagates through the power source distributing wiring and other circuits to the power source circuit and causes faults in the circuits powered by the power source circuit. Since a large number of signal wiring lines are ordinarily arranged in the proximity of the power source distributing wiring of the board, the leakage electromagnetic wave is easily coupled with the signal wiring lines. The leakage electromagnetic wave coupled with the signal wiring lines deteriorates the signal quality and propagates as a high-frequency current through the signal wiring lines to an external signal cable of the digital device. Resultantly, the external signal cable serves as an antenna to radiate an unnecessary high-level electromagnetic wave into the air.

Moreover, part of the leakage electromagnetic wave propagating through the power source distributing wiring passes through the power source circuit to propagate into a commercial alternating-current (ac) power source line, which serves as an antenna to radiate an unnecessary high-level electromagnetic wave into the air. On the other hand, since the leakage electromagnetic wave propagating through the power source distributing wiring advances by repeatedly being reflected at intermediate points of the power source distributing wiring, part of the wave also propagates to the signal wiring lines to deteriorate the signal waveform.

A drastic measure to solve the problem described above is preventing the electromagnetic wave generated by an operation of the circuit shown in FIG. 1 (for example, by a switching operation of a switching element) from leaking into the power source distributing wiring. For this purpose, it is required that impedance with respect to a high frequency of the power distributor circuit observed when the power distributor circuit is viewed from the circuit generating the electromagnetic wave be extremely reduced for all frequency bands contained in the electromagnetic wave.

When the impedance of the power distributor circuit viewed from a transistor is zero, the electromagnetic wave excited by the transistor reflects on an entrance of the power source distributing wiring and hence the electromagnetic wave does not enter the power distributor circuit.

An element used to reduce the impedance of the power source distributing wiring is a capacitor. The capacitor has a long history as a part used in electric and electronic devices, and capacitors of various forms have been put to practical uses. There have been developed, for example, a ceramic capacitor configured by laminating a plurality of layers of ceramic materials each of which including a metallic thin film evaporated thereon and a solid electrolytic capacitor having a configuration in which a porous molded body of metal having a function of a valve such as tantalum and aluminum is employed as an anode and a conductive polymer is used as a solid electrolyte with an oxidized film of the anode as dielectric.

As for a solid electrolytic capacitor, there have been known a solid electrolytic capacitor including, polypyrrole as a solid electrolyte on an oxidized film of a dielectric or an alkyl-substituted material thereof (reference is to be made to, for example, Japanese Patent Application Examined Laid-Open No. 4-56445 (Japanese Patent Application Laid-Open No. 60-37114) or a solid electrolytic capacitor and a method of manufacturing the same in which polyaniline is formed as a solid electrolyte on an oxidized film of a dielectric (reference is to be made to, for example, Japanese Patent Application Laid-Open No. 3-35516). These capacitors adopt as a solid electrolyte a conductive polymer with conductivity higher at least two orders of magnitude than that of the capacitors developed before these capacitors. Therefore, these capacitors have small equivalent series resistance and an advantage up to a high-frequency range which is larger at least two orders of magnitude than that of the capacitors developed before these capacitors even when the capacitors have the same capacity.

However, since these capacitors have a two-terminal structure to implement a function to charge and to discharge electricity, impedance between the terminals remarkably increases in a high-frequency range exceeding 10 MHz, and hence the capacitors are not suitable for a power distributor circuit of a digital circuit. To overcome this difficulty, there has been developed a capacitor array in which a large number of small-sized laminated ceramic capacitor chips are arranged in parallel with each other. However, it is difficult to efficiently reduce the impedance value in the high-frequency range exceeding 10 MHz.

On the other hand, to cope with higher frequencies, a filter configuration has also been discussed. There has been proposed, for example, a noise filter of surface mount type including a meandering conductor and a ground conductor interposed between ceramic dielectric sheets (reference is to be made to, for example, Japanese Patent Application Laid-Open No. 6-53046). FIG. 2 is a cross-sectional view showing a configuration of the noise filter of surface mount type including a meandering conductor and a ground conductor interposed between ceramic dielectric sheets.

As shown in FIG. 2, the conventional filter of surface mount type has a configuration in which a first dielectric sheet 110, a second dielectric sheet 120, and a third dielectric sheet 130 are laminated. On a boundary between the first and second dielectric sheets 110 and 120, a first internal conductor 111, a meandering conductor 115, and a second internal conductor 112 are disposed to propagate signals. On a boundary between the second and third dielectric sheets 120 and 130, a ground conductor 125 is formed to oppose the meandering conductor 115.

An end of the first internal conductor 111 is connected to a first signal electrode 151, an end of the second internal conductor 112 is connected to a second signal electrode 152, and the meandering conductor 115 is connected between the other ends of the first and second internal conductors 111 and 112. Using this configuration, there can be obtained a noise filter superior in a high-frequency noise absorption characteristic to the conventional noise filters constructed by combining an inductance element with a capacitance element.

Furthermore, in such filters of surface mount type, an electric signal supplied via one of the electrodes, for example, the first signal electrode 115 is filtered, and the filtered electric signal is delivered to the other electrode (the second signal electrode 152). However, in the filters of surface mount type, capacitance formed in a distributed-constant fashion is configured by the ground conductor 125, the meandering conductor 115, and the dielectric sheets laminated therebetween, and hence it is difficult to efficiently lower the impedance value in the high-frequency range exceeding 10 MHz only by the distributed capacitance. Therefore, part of the internal conductor is formed as a meandering conductor to enhance the signal attenuating effect by combining capacity with series inductance.

PROBLEM TO BE SOLVED BY THE INVENTION

As described above, there have been developed, for example, a ceramic capacitor configured by laminating a plurality of layers of ceramic material onto which a metallic thin film is evaporated and a solid electrolytic capacitor with a configuration in which a porous molded body of metal having a function of a valve such as tantalum and aluminum is employed as an anode and a conductive polymer is used as a solid electrolyte with an oxidized film of the anode as dielectric, and the capacitors have been adopted for various purposes as capacitors available up to a high-frequency range. However, consideration has not been given to a configuration in which these capacitors are used as line-type capacitors from the viewpoint of electromagnetic wave transmission and further the two-terminal structure is employed only to implement the function to charge and discharge electricity so that impedance abruptly increases in the high-frequency range exceeding 10 MHz.

Therefore, in operation under a clock frequency exceeding several hundreds of megaherz, there arises a problem that it is not possible, as long as a capacitor having such function is employed, to fully reduce the internal impedance of the power source under the high frequency.

Additionally, although a filter of surface mount type has been developed to remove noise, the filter does not reduce the impedance value to the maximum extent. Therefore, there exist problems that the filter limits use thereof as a capacitor, and in particular, it is difficult to realize the low impedance in a high-frequency range exceeding 100 MHz.

The present invention has been devised in consideration of the situation described above and has an object to provide an element of parallel flat plate line type and a circuit board which are primarily employed for a bypass filter of a noise filter and a decoupling element and which are suitable for a higher speed and a higher frequency.

DISCLOSURE OF THE INVENTION

To achieve the objects in accordance with claim 1 of the present invention, there is provided an element of parallel flat plate line type comprising a first metallic member including a first flat plate section and a projected section in which a plurality of projections are formed to stand on one surface of the first flat plate section in a direction substantially vertical to the surface with gaps therebetween, a second metallic member including a second flat plate section and a projected section in which a plurality of projections are formed to stand on one surface of the second flat plate section in a direction substantially vertical to the surface with gaps therebetween, and a dielectric film formed between the projections and the gaps of the element of parallel flat plate line type formed by inserting the projections of the first metallic member in the gap of the second metallic member and inserting the projections of the second metallic member in the gap of the first metallic member, wherein a transmission line is formed between the first and second metallic members along the dielectric film, the transmission line being formed such that for a high-frequency electromagnetic wave ranging from 100 kHz to 10 GHz which is supplied from an input terminal of the transmission line and is delivered to an output terminal thereof, the transmission line has transmittivity ranging from −140 dB to −20 dB.

In accordance with claim 2 of the present invention, the projected section of the first metallic member and the projected section of the second metallic member have a contour of a flat plate.

In accordance with claim 3 of the present invention, the projected section of the first metallic member has a contour of a projected and recessed plate and includes a standing flat plate section and a plurality of prism sections disposed on a surface of the standing flat plate section with a predetermined gap therebetween in a direction vertical to the first flat plate section, the projected section of the second metallic member has a contour of a projected and recessed plate and includes a standing flat plate section and a plurality of prism sections disposed on a surface of the standing flat plate section with a predetermined gap therebetween in a direction vertical to the second flat plate section.

In accordance with claim 4 of the present invention, the projected section of the first metallic member has a contour of a projected and recessed plate in which saw-toothed projections are disposed on a side surface of the projected section, the saw-toothed projection having a cross section in a contour of a saw tooth parallel to the first flat plate section, the projected section of the second metallic member has a contour of a projected and recessed plate in which saw-toothed projections are disposed on a side surface of the projected section, the saw-toothed projection having a cross section in a contour of a saw tooth parallel to the second flat plate section.

In accordance with claim 5 of the present invention, the element of parallel flat plate line type is characterized in that input dc power is transmitted along the first metallic member and the second metallic member.

In accordance with claim 6 of the present invention, the element of parallel flat plate line type is characterized in that the first metallic member or the second metallic member includes metal having a valve function, and the dielectric film is formed on a surface of the metal having a valve function.

In accordance with claim 7 of the present invention, the element of parallel flat plate line type is characterized in that a conductive material layer including a conductive material is filled in a space between the dielectric film and the first metallic member or the second metallic member.

In accordance with claim 8 of the present invention, the element of parallel flat plate line type is characterized in that the conductive material layer includes conductive polymer.

In accordance with claim 9 of the present invention, the element of parallel flat plate line type is characterized in that the conductive material layer is either one selected from a group including polypyrrole, polythiophene, polyaniline, and derivatives thereof.

In accordance with claim 10 of the present invention, the element of parallel flat plate line type is characterized in that the metal having a valve function is aluminum, tantalum, or niobium.

In accordance with claim 11 of the present invention, the element of parallel flat plate line type is characterized by including a side-surface shield plate disposed on a side surface of each of the first and second flat plate sections to prevent outward leakage of electromagnetic wave.

In accordance with claim 12, the invention is comprising an element of parallel flat plate line type comprising a first metallic member including a plurality of first projected sections disposed to stand on a first flat plate section to be substantially parallel to each other with a gap section therebetween, both end sections of the first flat plate section being first terminals, a second metallic member including a plurality of second projected sections disposed to stand on a second flat plate section to be substantially parallel to each other with a gap section therebetween, both end sections of the second flat plate section being first terminals, and a dielectric film formed on a surface on a side on which the projected sections are disposed, and a transmission path formed along the dielectric film; a substrate; and first power source wiring and second power source wiring formed on the substrate, wherein both end sections of the first flat plate section and both end sections of the second flat plate section are respectively inserted in to be connected to the first power source wiring and the second power source wiring, and the transmission line is formed such that for a high-frequency electromagnetic wave ranging from 100 kHz to 10 GHz which is supplied from an input terminal of the transmission line and which is delivered to an output terminal thereof, the transmission line has transmittivity ranging from −140 dB to −20 dB.

As above, in accordance with the present invention, the element of parallel flat plate line type is so constructed that the transmission line of the element is formed such that for a high-frequency electromagnetic wave ranging from 100 kHz to 10 GHz which is supplied from an input terminal of the transmission line and which is delivered to an output terminal thereof, the transmission line has transmittivity of more than or equal to −140 dB and less than or equal to −20 dB. Therefore, the characteristic impedance of the element of parallel flat plate line type can be designed to be fully low, and hence it is possible to prevent an electromagnetic wave occurring from noise sources from entering the power distributing circuit side.

Also, there is configured the element of parallel flat plate line type which is one of the transmission line configurations, and hence frequency dependence of the characteristic impedance of the line decreases; and the line is constructed in the contour of projections and depressions, and hence a one-layer line is elongated for a high frequency for which power is concentrated on a metallic surface. Therefore, a high-frequency electromagnetic wave supplied from one side of the metal having a valve function is filtered in a wide frequency band by the thin film of the dielectric film and the conductive material, and hence there can be implemented a line-type element suitable for a higher speed and a higher frequency.

Moreover, when the conductive material layer includes conductive polymer, it is possible to easily obtain an element of parallel flat plate line type usable up to a high-frequency range. When the conductive polymer is either one of polypyrrole, polyaniline, and derivatives thereof, it is possible to form a layer of conductive material superior in the environmental stability and stable up to 100 degree centigrade or more and hence it is possible to easily obtain an element of parallel flat plate line type superior in stability and durability and usable up to a high-frequency range.

Furthermore, when the metal having a valve function to configure the first or second metallic member is aluminum, tantalum, or niobium, it is possible to form a dielectric film having a high dielectric constant and being uniform and stable, and hence it is possible to easily obtain a stable element of parallel flat plate line type superior in high volume efficiency.

BRIEF DESCRIPTION OF DRAWINGS

FIG. 11 is a partial cross-sectional view of the element of parallel flat plate line type in the first embodiment according to the present invention in which (a) is a cross-sectional view (in a line direction) of a cross section X-X' of FIG. 10 and (b) is a cross-sectional view of a cross section Y-Y' of FIG. 10.

FIG. 13 is a partial cross-sectional view of the element of parallel flat plate line type in the second embodiment according to the present invention in which (a) is a cross-sectional view (in a line direction) of a cross section X-X' of FIG. 12 and (b) is a cross-sectional view of a cross section Y-Y' of FIG. 12.

FIG. 15 is a partial cross-sectional view of the element of parallel flat plate line in the third embodiment according to the present invention in which (a) is a cross-sectional view (in a line direction) of a cross section X-X' of FIG. 14 and (b) is a cross-sectional view of a cross section Y-Y' of FIG. 14.

Figure 1:
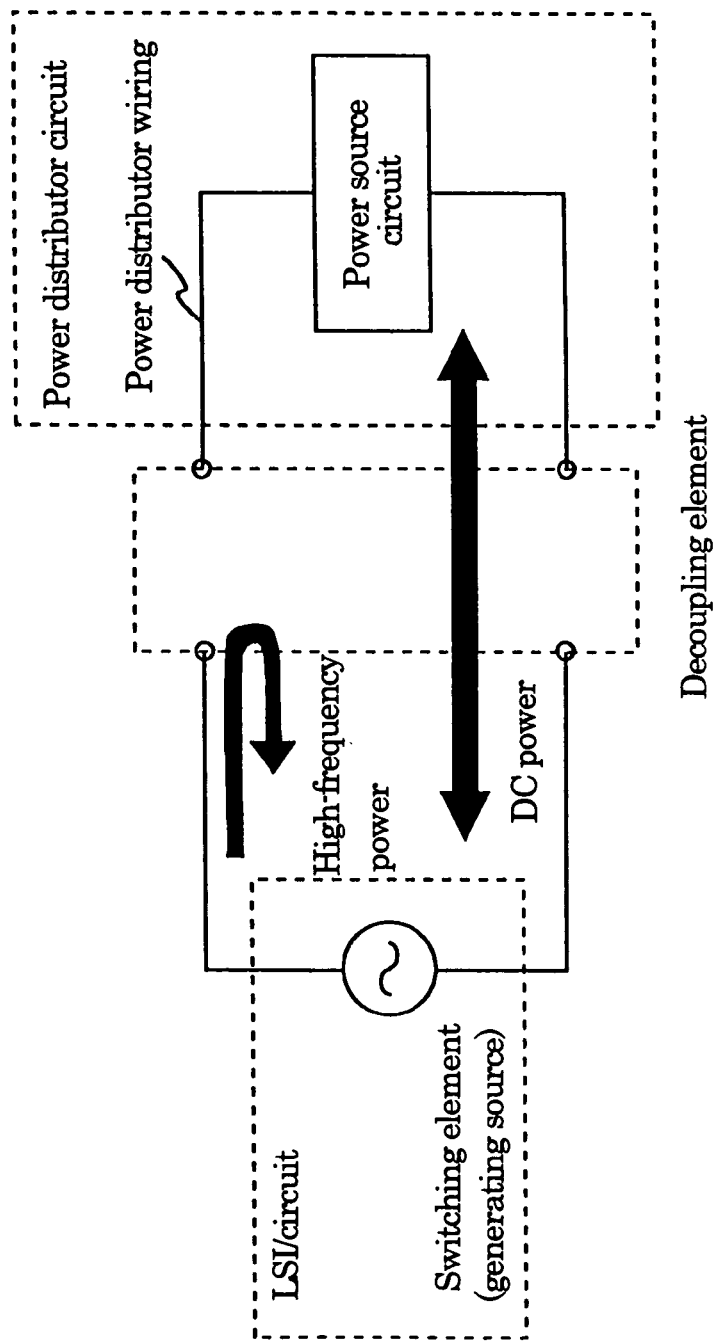
FIG. 1 is a diagram to explain influence which power generated from a switching element included in an LSI circuit exerts onto power source distributing wiring.
Figure 2:
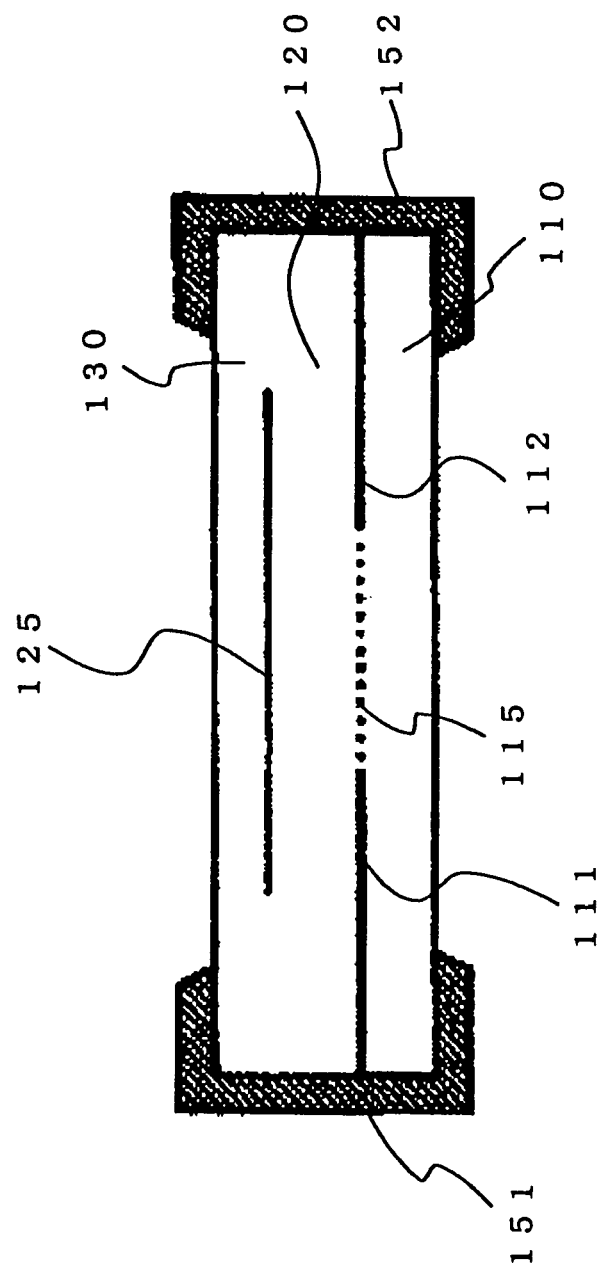
FIG. 2 is a cross-sectional view showing a conventional configuration of a filter of surface mount type.

In the respective diagrams, reference numerals 1, 4, and 7 indicate first metallic members. Reference numerals 2, 5, and 8 indicate second metallic members. Reference numerals 11, 21, 41, 51, 71, and 81 indicate parallel flat plate sections. Reference numerals 11a, 11b, 41a, 41b, 71a, and 71b indicate cathode lead terminals. Reference numerals 12, 22, 42, 52, 72, and 82 indicate projected sections. Reference numerals 13, 23, 43, 53, 73, and 83 indicate gap sections. Reference numerals 14, 44, and 74 indicate side-surface shield plates. Reference numerals 21a, 21b, 51a, 51b, 81a, and 81b indicate anode lead terminals. A reference numeral 31 indicates a dielectric film. Reference numerals 42a and 52a indicate standing plate sections. Reference numerals 42b and 52b indicate prism sections. Reference numerals 72a and 82b indicate saw-toothed projections. A reference numeral 110 indicates a first dielectric sheet. A reference numeral 111 indicates a first internal conductor. A reference numeral 112 indicates a second internal conductor. A reference numeral 115 indicates a meandering conductor. A reference numeral 120 indicates a second dielectric sheet. A reference numeral 125 indicates a ground conductor. A reference numeral 130 indicates a third dielectric sheet. A reference numeral 151 indicates a first signal electrode. A reference numeral 152 indicates a second signal electrode.

BEST MODE FOR CARRYING OUT THE INVENTION

Figure 3:
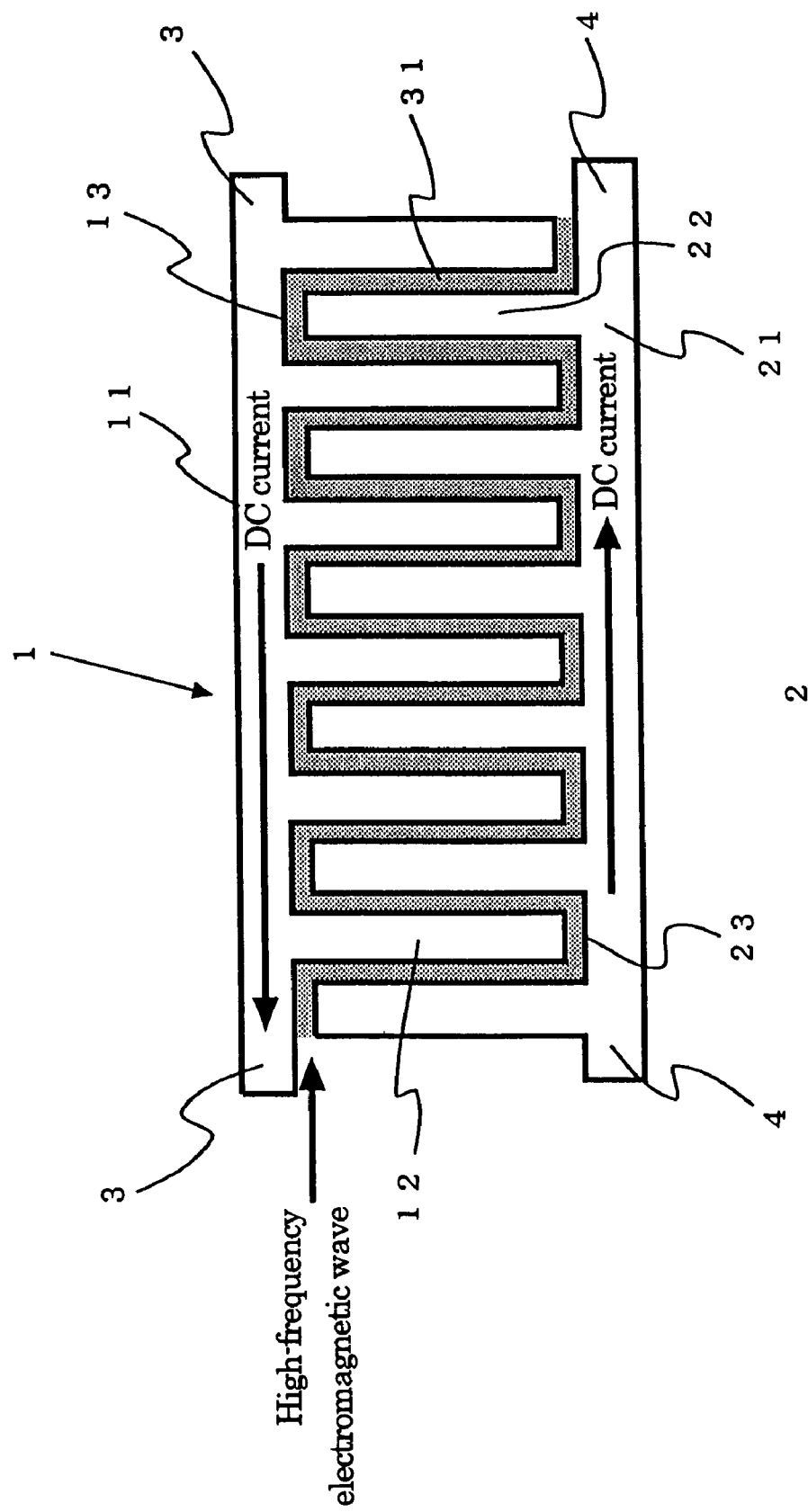
FIG. 3 is a diagram to explain a configuration and operation of an element of parallel flat plate line type according to the present invention.

First, description will be given of a concept of the present invention by referring to FIG. 3. As shown in FIG. 3, the present invention is characterized by forming, between a first metallic member 1 and a second metallic member 2 arranged in substantially parallel with each other, a transmission line having a contour meandering between these metallic members. These first and second metallic members 1 and 2 include parallel flat plate sections (11, 21) and projected sections (12, 22) on one surface of each of the plate sections, each projected section including a plurality of projections standing in a direction substantially vertical to the surface with gap sections (13, 23) therebetween. Additionally, dielectric films are formed on surfaces of the projected section and the gap section of either one of the first and second metallic members 1 and 2. The projected section 12 of the first metallic member 1 is inserted into the gap section 23 of the second metallic member and the projected section 22 of the second metallic member 2 is inserted into the gap section 13 of the first metallic member to thereby form an element of parallel flat plate line type.

The element of parallel flat plate line type of the present invention formed as above is characterized by forming, between the first and second metallic members 1 and 2, a transmission line along the dielectric film 31 such that for a high-frequency electromagnetic wave ranging from 100 kHz to 10 GHz which is supplied from an input terminal of the transmission line and is delivered to an output terminal thereof. The transmission line has transmittivity of ranging from about −140 dB to −20 dB, more favorably, transmittivity ranging from −40 dB to −60 dB. Here −140 dB is introduced as one example of the lowest limit of the transmittivity but the value of the lowest limit depends on a network analyzer's measurement performance. The more the performance of network analyzer improves, the more the range of the transmittivity extends.

Figure 4:
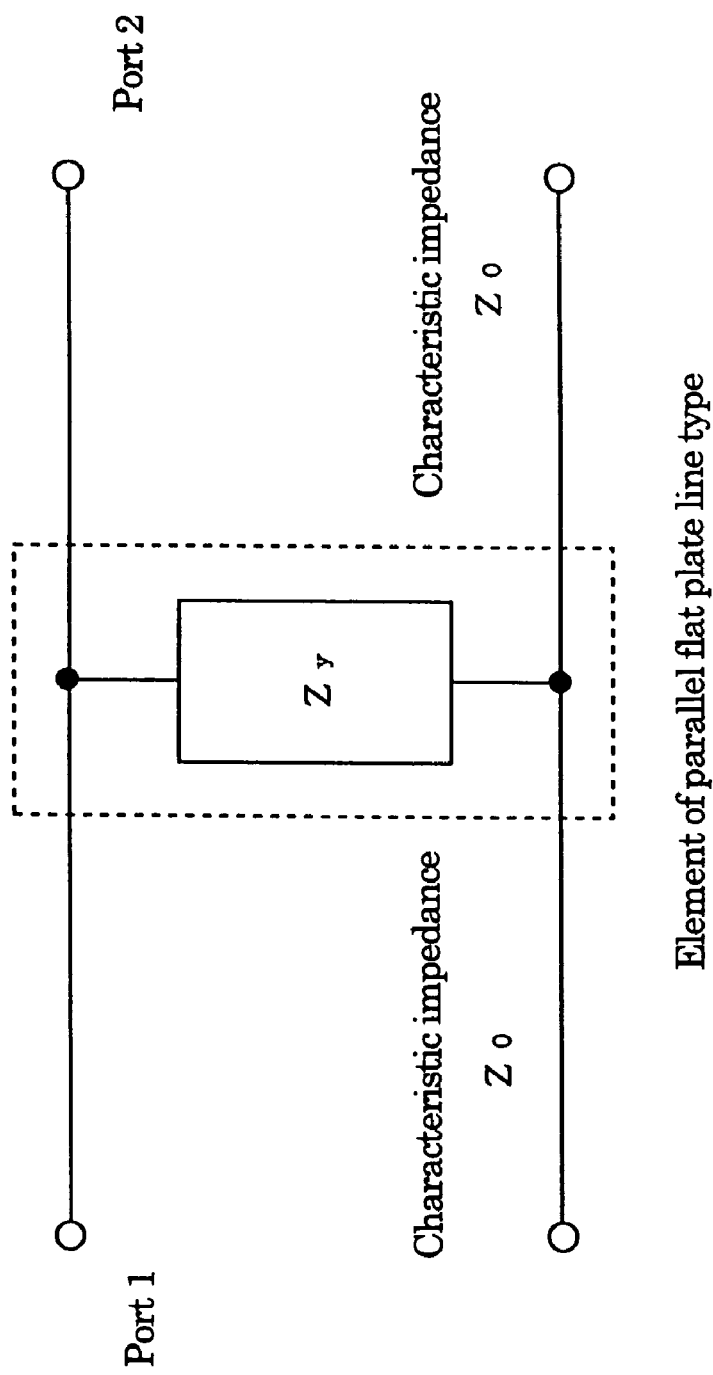
FIG. 4 is an equivalent circuit diagram to calculate a reflection coefficient Γ and a transmission coefficient T on a line.

Impedance of the element of parallel flat plate line type can be evaluated by a circuit having fixed characteristic impedance Z0 as shown in FIG. 4. A characteristic of the element of parallel flat plate line type is indicated by a transmission characteristic from port 1 to port 2 as shown in FIG. 4. A reflection coefficient Γ and a transmission coefficient T to evaluate this circuit are an element S11 and an element S21 of a scattering matrix [S] and are represented by the following expression.

$$[S] = \frac{1}{2\hat{Z}y+1}\begin{bmatrix} -1 & 2\hat{Z}y \\ 2\hat{Z}y & -1 \end{bmatrix} \text{ where, } \hat{Z}y = \frac{Zy}{Z0} \quad (1)$$

$$\Gamma = S11 = \frac{-1}{2\hat{Z}y+1} = \frac{-1}{2(Zy/Z0)+1} \quad (2)$$

$$T = S21 = \frac{2\hat{Z}y}{2\hat{Z}y+1} = \frac{2(Zy/Z0)}{2(Zy/Z0)+1} \quad (3)$$

where, Z0 indicates characteristic impedance of an input/output line of the element of parallel flat plate line type and Zy represents impedance thereof. Therefore, if Z0>>Zy, Γ≈−1 and T≈0, and hence the element can reflect the input high-frequency electromagnetic wave in the vicinity of the entrance of the transmission line.

Figure 5:
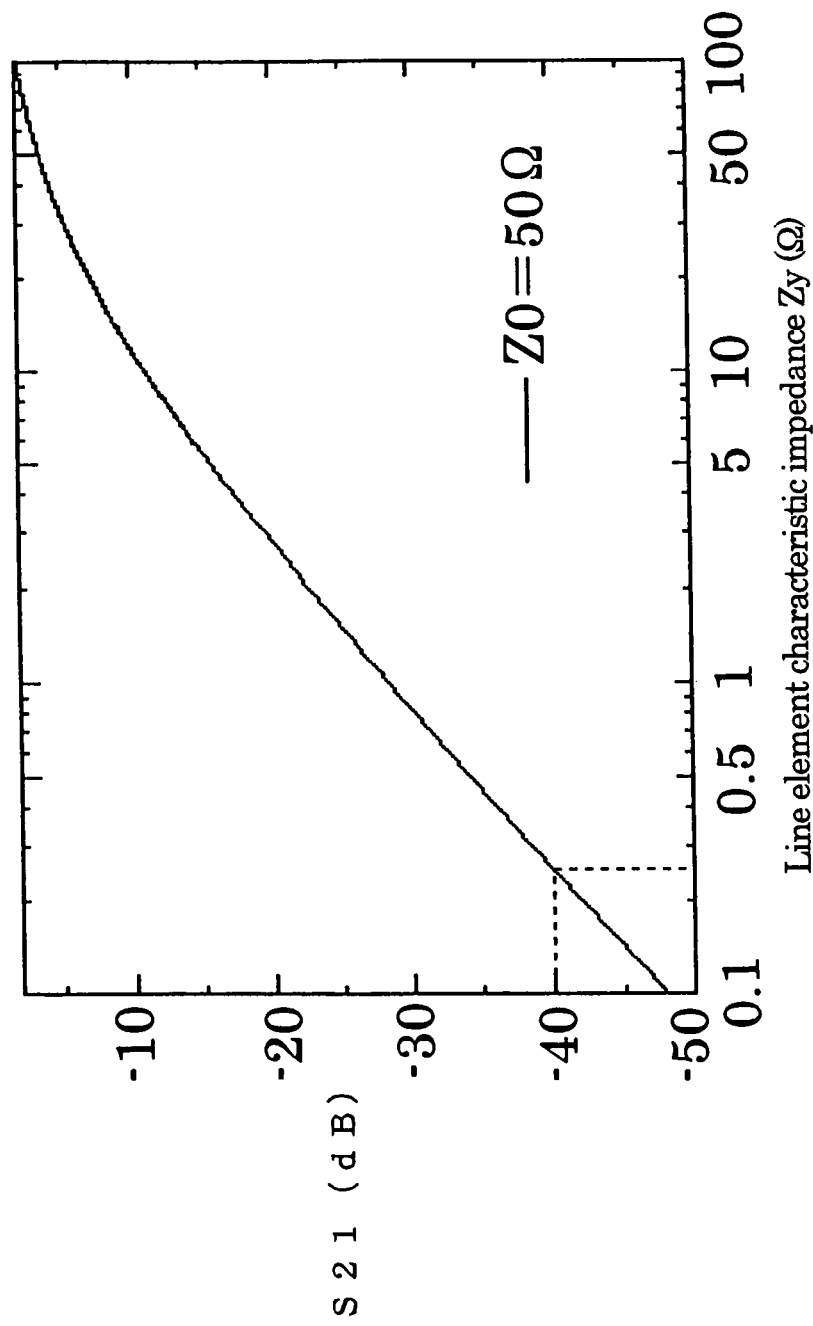
FIG. 5 is a diagram showing a relationship between a transmission characteristic S21 and characteristic impedance Zy of a line.

The present invention is characterized by forming a transmission line of which the transmittivity is ranging from −140 dB to −20 dB, or more favorably, of which transmittivity ranges from −40 dB to −60 dB for a high-frequency electromagnetic wave ranging from 100 kHz to 10 GHz which is supplied from an input terminal of the transmission line and is delivered to an output terminal thereof. Therefore, it is possible to design low characteristic impedance for the element of parallel flat plate line type as indicated by the diagram of FIG. 5 showing a relationship between the characteristic impedance and S21 of the line element.

Figure 6:
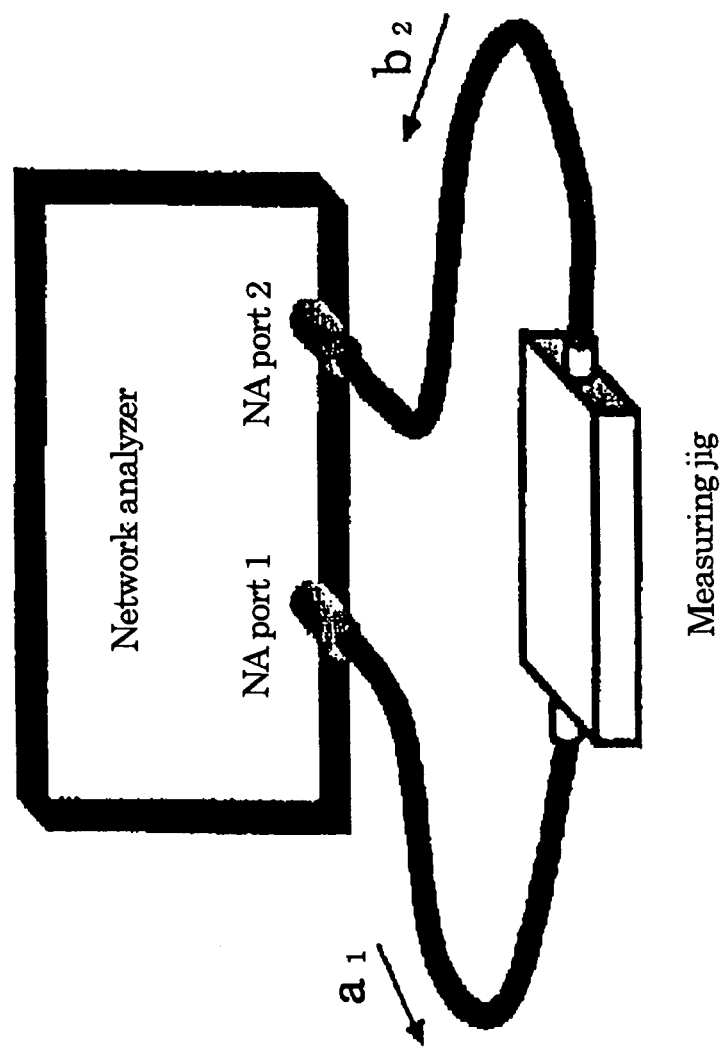
FIG. 6 is a diagram showing a configuration of a network analyzer.

Incidentally, the S21 characteristic is measured by an S parameter measuring set of the network analyzer shown in FIG. 6. The characteristic impedance of the measuring system is 50 Ω. A coaxial line (50 Ω) is connected to a signal input terminal and a signal output terminal of the network analyzer and a measuring jig shown in FIG. 6 is inserted between the terminals at an intermediate point thereof. For the measurement, an element of parallel flat plate line type is mounted inside the measuring jig. The transmission coefficient S21 is obtained as a ratio (b2/a1) between a signal a1 applied via an NA port 1 of the network analyzer shown in FIG. 6 and a signal b2 transmitted to an NA port 2 of the network analyzer shown in FIG. 6.

Description will now be given of behavior of a high-frequency electromagnetic wave and ac power in the element of parallel flat plate line type.

As described above, the high-frequency electromagnetic wave ranging from 100 kHz to 10 GHz to be handled by the present embodiment is reflected in the neighborhood of the entrance of the transmission line. However, electromagnetic waves of frequencies other than the objective frequencies (for example, electromagnetic waves of frequencies equal to or less than 100 kHz) propagate inside the transmission line to be delivered to the side of the power distributing line shown in FIG. 1. However, the frequency of the electromagnetic wave delivered to the power distributing line side is quite low and hence does not become a noise source of the power distributing line.

Figure 7:
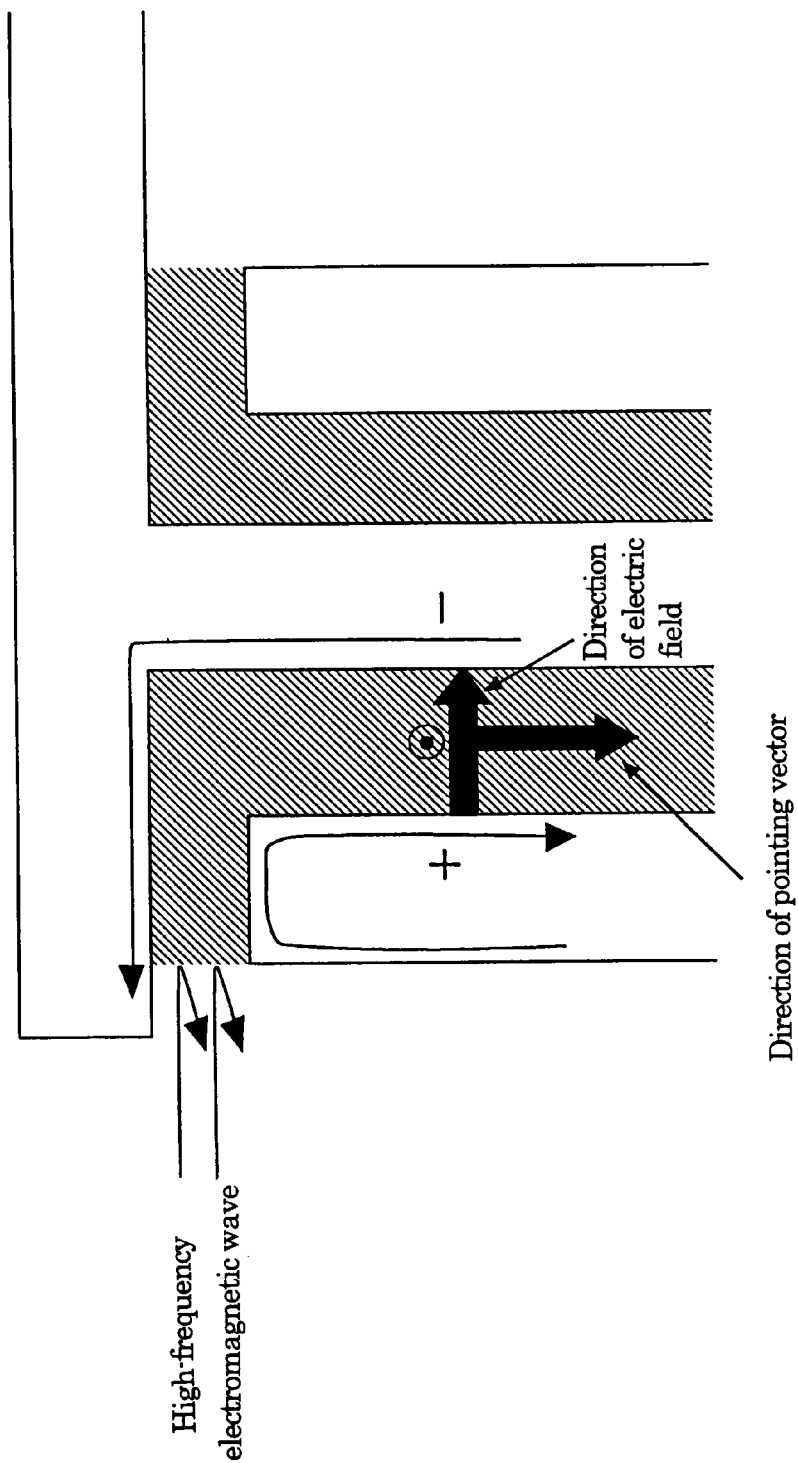
FIG. 7 is a diagram to explain interaction between an electromagnetic wave and a current on a transmission line.

Additionally, the ac current (ac power) supplied via the power source circuit flows through the first and second metallic members 1 and 2 as shown in FIG. 7. In this situation, for example, when plus charge flows through the second metallic member 2 and minus charge flows through the first metallic member 1, an electric field appears in a direction from the second metallic member 2 to the first metallic member 1 as shown in FIG. 7. Also, a magnetic field appears in a direction from the rear to the front of FIG. 7. Due to the electromagnetic field, an electromagnetic wave propagates inside the transmission line.

Referring next to the drawings, description will be given of an embodiment of the element of parallel flat plate line type in accordance with the present invention.

Figure 8:
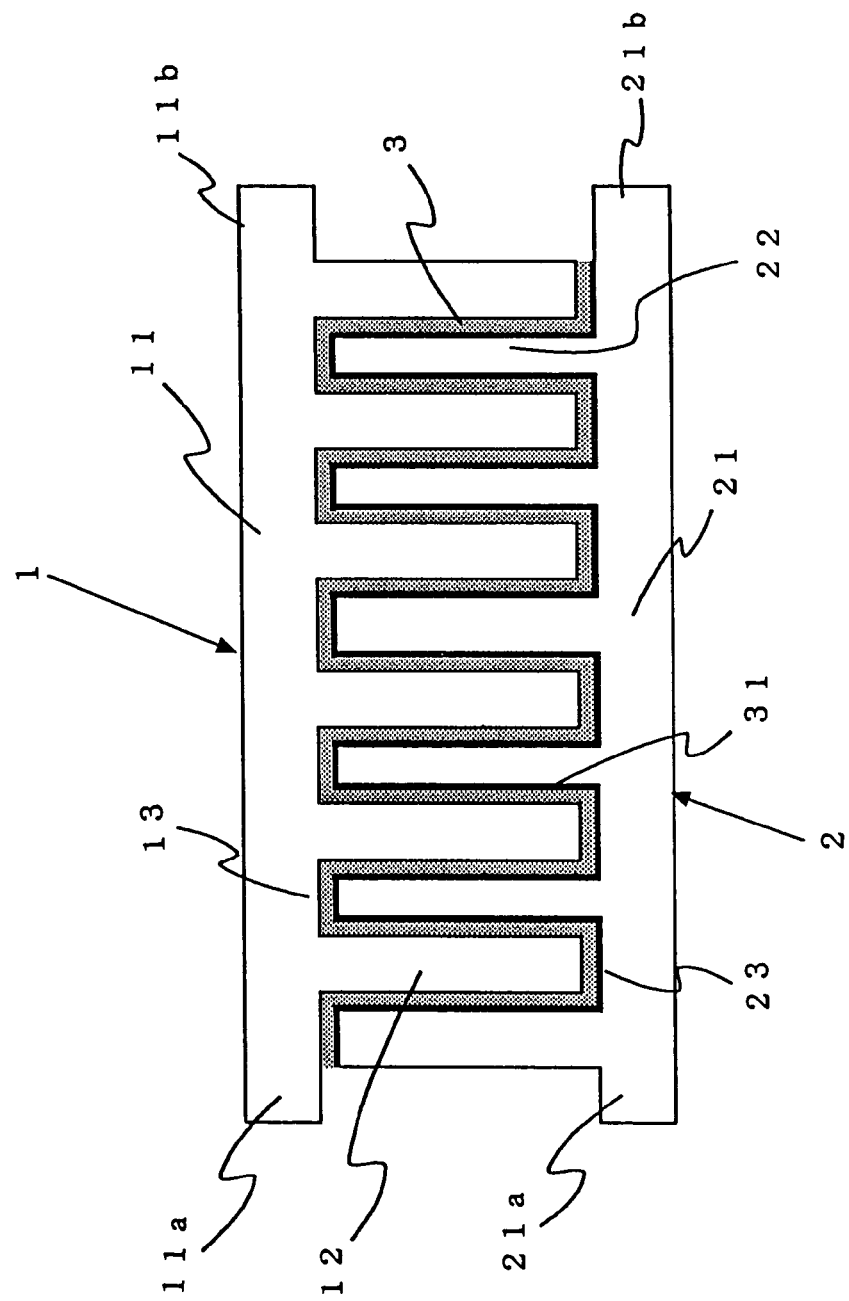
FIG. 8 is a cross-sectional view of an element of parallel flat plate line type in a first embodiment according to the present invention.
Figure 9:
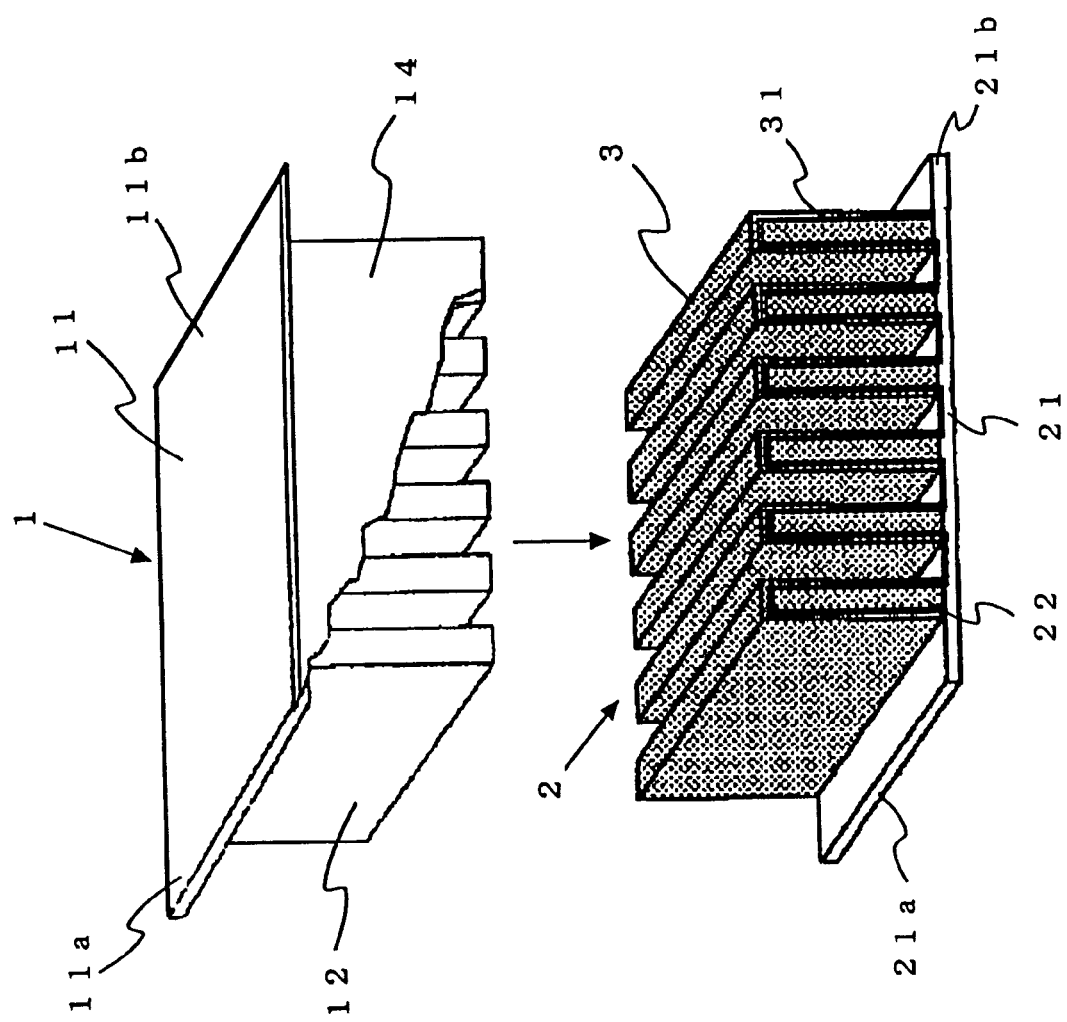
FIG. 9 is a perspective view of the element of parallel flat plate line type in the first embodiment according to the present invention before assembly.
Figure 10:
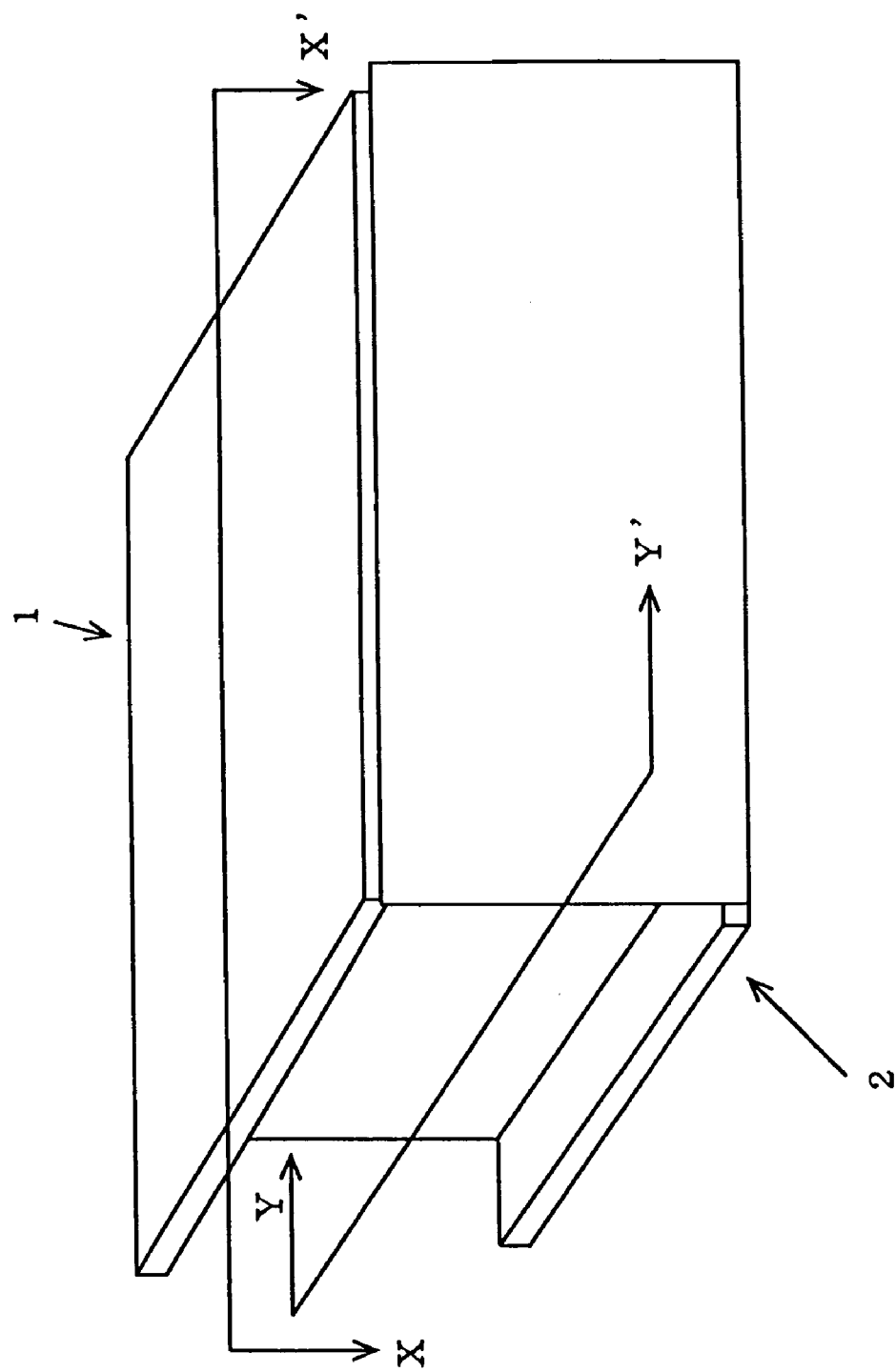
FIG. 10 is a perspective view of the element of parallel flat plate line type in the first embodiment according to the present invention.

FIG. 8 is a cross-sectional view of the element of parallel flat plate line type in a first embodiment according to the present invention, FIG. 9 is a perspective view showing a configuration of the element of parallel flat plate line type in the first embodiment of the present invention before assembly, FIG. 10 is a perspective view of the element of parallel flat plate line type in the first embodiment of the present invention, and FIG. 11 is a partial cross-sectional view of the element of parallel flat plate line type in the first embodiment of the present invention in which (a) is a cross-sectional view (in a line direction) of a cross section X-X' of FIG. 10 and (b) is a cross-sectional view of a cross section Y-Y' of FIG. 10.

The first embodiment of the element of parallel flat plate line type of the present invention includes, for example, a first metallic member 1, a second metallic member 2, and a conductive material layer 3 as shown in the cross-sectional view of FIG. 8.

The first metallic member 1 includes a parallel flat plate section 11 and a plurality of projected sections 12 of a parallel flat plate shape arranged to stand vertically with respect to the section 11 with an equal interval therebetween. The second metallic member 2 includes metal having a function of a valve and includes a parallel flat plate section 21 and a plurality of projected sections 22 of a parallel flat plate shape arranged to stand vertically with respect to the section 11 with an equal interval therebetween, and a dielectric film 31 is disposed on a surface of the side on which the projected sections 22 are arranged. The first and second metallic members 1 and 2 have contours such that the projected sections 12 and 22 of the respective members engage with gap sections 23 and 13 of the associated members with a predetermined gap therebetween, and the gap is filled with a conductive material layer 3. On both end parts of the parallel flat plate sections 11 and 12 of the first and second metallic members 1 and 2 in the direction orthogonal to the projected sections 12 and 22, cathode lead terminals 11a and 11b and anode lead terminals 21a and 21b are disposed. Surfaces on both sides other than the sides on which the electrode lead terminals are disposed are covered with a side-surface shield plate 14 arranged on the metallic member 1. In this regard, the plural projected sections 12 and 22 need only to be substantially orthogonal to the parallel flat plate sections 11 and 21 and it is not necessary that the gaps between the projections are all equal to each other.

The present embodiment configured as above is characterized by forming the transmission line such that for a high-frequency electromagnetic wave ranging from 100 kHz to 10 GHz which is supplied from an input terminal of the transmission line and which is delivered to an output terminal thereof, the transmission line has transmittivity ranging from −140 dB to −20 dB, more favorably, transmittivity ranging from −40 dB to −60 dB.

The reflection coefficient r and the transmission coefficient T to evaluate the characteristic of the element of parallel flat plate line type are elements S11 and S21 of the scattering matrix [S] and are represented by expression (1) described above.

Therefore, if $Z0 \gg Zy$, $\Gamma = -1$ and $T \approx 0$, and hence the element can reflect the input high-frequency electromagnetic wave in the vicinity of the entrance of the transmission line. In the present invention, the transmission line is configured such that the transmittivity thereof is ranging from −140 dB to −20 dB, or more favorably, the transmittivity thereof ranges from −40 dB to −60 dB for a high-frequency electromagnetic wave ranging from 100 kHz to 10 GHz which is supplied from an input terminal of the transmission line and which is delivered to an output terminal thereof. Therefore, it is possible to design low characteristic impedance for the element of parallel flat plate line type as shown in FIG. 5.

In addition, to configure the transmission line such that the transmittivity thereof for the high-frequency electromagnetic wave is ranging from −140 dB to −20 dB, or more favorably, the transmittivity thereof ranges from −40 dB to −60 dB, the present embodiment has a configuration as below. The dielectric film interposed between the metal having a valve function (the second metallic member) and acting as an electrode of the capacitor and the conductive polymer is formed to have quite small thickness, and hence the distance between the electrode plates is decreased and the capacity of the capacitor can be increased. Moreover, a metal having a valve function is used as the metal to form the electrode plate (the second metallic member 2) with a large cross section area of the electrode plate, and hence the self-inductance component can be reduced.

In a transmission line for which loss is negligible, characteristic impedance Zs is determined by the following expression using inductance per unit length and electrostatic capacity per unit length.

$$Zs = \sqrt{L/C} \quad (4)$$

Therefore, to reduce the characteristic impedance, it is only necessary to minimize the inductance per unit length to increase the electrostatic capacity per unit length.

Consequently, in the element of parallel flat plate line type of the present invention, by minimizing the inductance per unit length and by increasing the electrostatic capacity per unit length, it is possible to reduce the characteristic impedance of the line to thereby filter the high-frequency electromagnetic wave generated from the switching element and the like.

Materials of the conductive material layer 3 are not particularly limited only if the materials are electrically conductive, and there are used various metals, semiconductors using manganese dioxide, indium oxide, and the like, and organic conductors such as a charge transfer complex of tetracyanoquinodimethane and tetrathiafulvalene. Particularly, there are favorably used conductive polymers such as polypyrrole, polythiophene, polyethylenedioxithiophene, polyaniline, polyphenylene, polyfuran, polythiazyl, polyphenylenevinylene, polyacetylene, and polyazulene. Among these materials, polypyrrole, polythiophene, polyaniline, and derivatives thereof are favorably used from the viewpoint of stability. In the present invention, polypyrrole, polythiophene, polyaniline, and derivatives thereof include, for example, materials obtained by adding various substituents to these compounds and materials obtained by copolymerizing these compounds with other polymers. In the present invention, the conductive polymer is ordinarily utilized by combining the polymer with dopant including an electron donative or attractive compound. In the present invention, the dopant is not particularly limited, and there is used any conventionally known dopant of conductive polymer. Such dopants include, for example, halogen compounds of iodine, chlorine, perchloric acid anion, and the like, compounds serving as Lewis acid such as an aromatic sulfone compound, and/or compounds serving as Lewis base such as lithium and tetraethylammonium cation.

The element of parallel flat plate line type of the present invention is configured by using a metal having a valve function for the second metallic member 2, uniformly forming the dielectric film 31 on a surface of the metal having the valve function, and filling the conductive material layer 3 in the gap between the first metallic member 1 and the dielectric film 31. In this situation, it is favorable that the conductive material layer 3 is tightly fixed onto the dielectric film 31 and has high transmittivity. The second metallic member 2 may be of a material having a low osmotic characteristic if its surface is smooth. However, when there is used a metal whose surface area is expanded by etching or the like to form fine projections and fine depressions to have a coarse surface and which has a valve function, it is favorable that the conductive material layer 3 includes a conductive polymer which can be tightly fixed onto the dielectric film 31 and which has high conductivity. Due to such configuration, there can be easily obtained an element of parallel flat plate line type usable up to the high-frequency range.

Furthermore, by configuring the conductive polymer using either one of polypyrrole, polythiophene, polyaniline, and derivatives thereof, it is possible to form a layer of a conductive material which has an environmentally stable characteristic and which is stable up to 100° C. or more, and hence it is possible to easily obtain an element of parallel flat plate line type which is superior in stability and durability and which can be used up to the high-frequency range.

The present invention does not particularly limit the method of creating these conductive polymers. There may be used a method where after conductive polymer solution penetrates a surface of the projected section 22 of the second metallic member 2 having a valve function, solvent thereof is vaporized, or a method in which a monomer and an oligomer to form a conductive polymer and a polymerization catalyst are introduced to directly polymerize a conductive polymer on a surface of the projected section 22 having substantially a shape of a flat surface, or a method of forming a layer of an intermediate product of a conductive polymer to thereafter convert the product into the conductive polymer.

In the present invention, the two or more anode lead terminals 21a and 21b disposed at positions apart from each other on the plate sections 21 of the second metallic member 2 are arranged to feed dc power (an electric signal) to the second metallic member 2 whose surface is covered with the dielectric film 31 and which has a valve function. Therefore, the terminals 21a and 21b are required to be separated from each other by a certain distance. In the present invention, it is also possible that the plate section 21 of the second metallic member 2 is projected, for example, onto both sides as the electrode lead terminals shown in FIG. 8 or members are attached by welding or crimping to be electrode lead terminals.

The present invention does not limit the kind of materials of the plate section 21 having a valve function and the second metallic member 2 having a plurality of projected sections 22, that is, metals for which a surface film such as tantalum, aluminum, niobium, titanium, zirconium, silicon, and magnesium can be formed are available, and the metals are used in the form of rolled foil, sintered fine powder, or the like. By creating the metal having a valve function using aluminum, tantalum, or niobium, it is possible to form a uniform and stable dielectric film 31 having a high dielectric constant, and hence there can be easily attained a stable element of parallel flat plate line type having high volume efficiency.

Furthermore, the method of forming the dielectric film 31 is not particularly limited to electrolytic formation using electrolytic solution or oxidization using an appropriate oxidizing agent. Alternatively, air-oxidized material may be used as a film. However, the electrolytic formation is ordinarily used. Also, the contour of the projected section 22 of the second metallic member 2 is not particularly limited only if the projections are in the form of depressions and projections, that is, the projected section 22 may be flat, curved, or partly bent. Moreover, in the present invention, a metallic member having a valve function and an expanded metallic surface area may be employed as the second metallic member 2. The second metallic member 2 having an expanded surface area includes a member obtained by working sintered fine powder into a form of projections and depressions, etching foil obtained by electrolytic etching of pressed foil or foil laser-worked in electrolysis solution, and the like. The second metallic member 2 having an expanded metallic surface area is a metal obtained by forming holes like sponge on the surface of the second metallic member, by etching or the like.

Additionally, in the present invention, the solid electrolyte as the conductive material and the first metallic member may be directly brought into contact with each other or may be connected to each other using conductive carbon paste or silver paste.

The element of line type of the present invention may be directly attached onto an electric circuit board for use, or lead electrodes may be drawn therefrom and the element is sealed using a resin, a metallic case, or the like.

Figure 12:
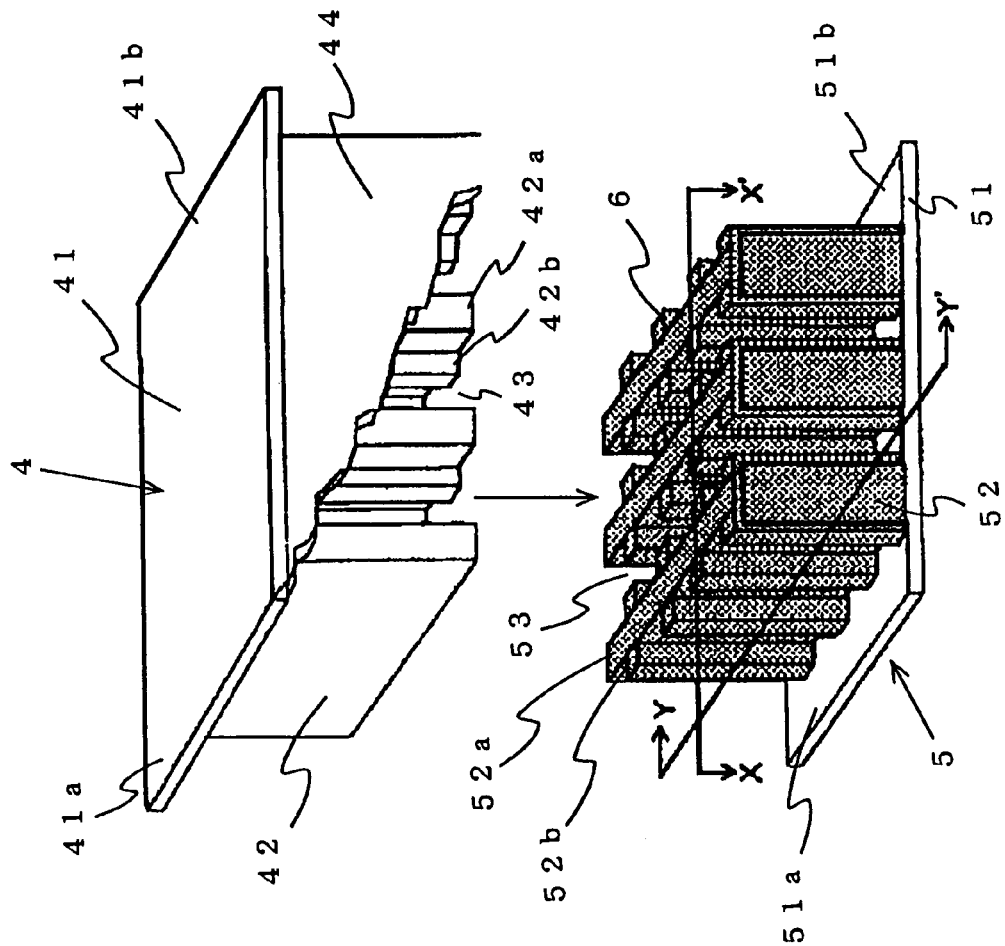
FIG. 12 is a perspective view showing a configuration of an element of parallel flat plate line type in a second embodiment according to the present invention before assembly.

Referring next to the drawings, description will be given of a second embodiment of the element of parallel flat plate line type in accordance with the present invention. FIG. 12 is a perspective view showing a configuration of an element of parallel flat plate line type in a second embodiment according to the present invention before assembly. FIG. 13 is a partial cross-sectional view of the element of parallel flat plate line type in the second embodiment according to the present invention in which (a) is a cross-sectional view (in a line direction) of a cross section X-X' of FIG. 12 and (b) is a cross-sectional view of a cross section Y-Y' of FIG. 12.

Also in the second embodiment of the present invention, the element of parallel flat plate line type includes, for example, a first metallic member 4, a second metallic member 5, and a conductive material layer 6 as shown in FIG. 12.

The first metallic member 4 includes a plurality of projected sections 42 arranged to stand vertically with respect to the plate section 41 with an equal interval therebetween, and the projected sections 42 include a stand plate section 42a and a plurality of prism sections 42b arranged on a surface of the stand plate section 42a with an equal interval therebetween vertically with respect to the plate section 41. The second metallic member 5 includes metal having a function of a valve and includes a plurality of projected sections 22 arranged to stand vertically with respect to the plate section 51 with an equal interval therebetween, and the projected sections 42 include a stand plate section 52a and a plurality of prism sections 52b arranged on a surface of the stand plate section 52a with an equal interval therebetween vertically with respect to the plate section 51, and a dielectric film 61 is disposed on a surface of the side on which the projected sections 52 are arranged.

The first and second metallic members 4 and 5 have contours such that the projected sections 42 and 52 of the respective members engage with gap sections 53 and 43 of the associated members with a predetermined gap therebetween, and the gap is filled with a conductive material layer 6. On both end sections of the parallel flat plate sections 41 and 51 of the first and second metallic members 4 and 5 in the direction orthogonal to the projected sections 42 and 52, cathode lead terminals 41a and 41b and anode lead terminals 51a and 51b are disposed. Surfaces on both sides other than the sides on which the electrode lead terminals are disposed are covered with a side-surface shield plate 44 arranged on the metallic member 4.

In the element of parallel flat plate line type of the second embodiment, only the contours of the projected sections 42 and 52 differ from those of the projected sections 12 and 22 of the first embodiment and hence detailed description of the element will be avoided.

Figure 14:
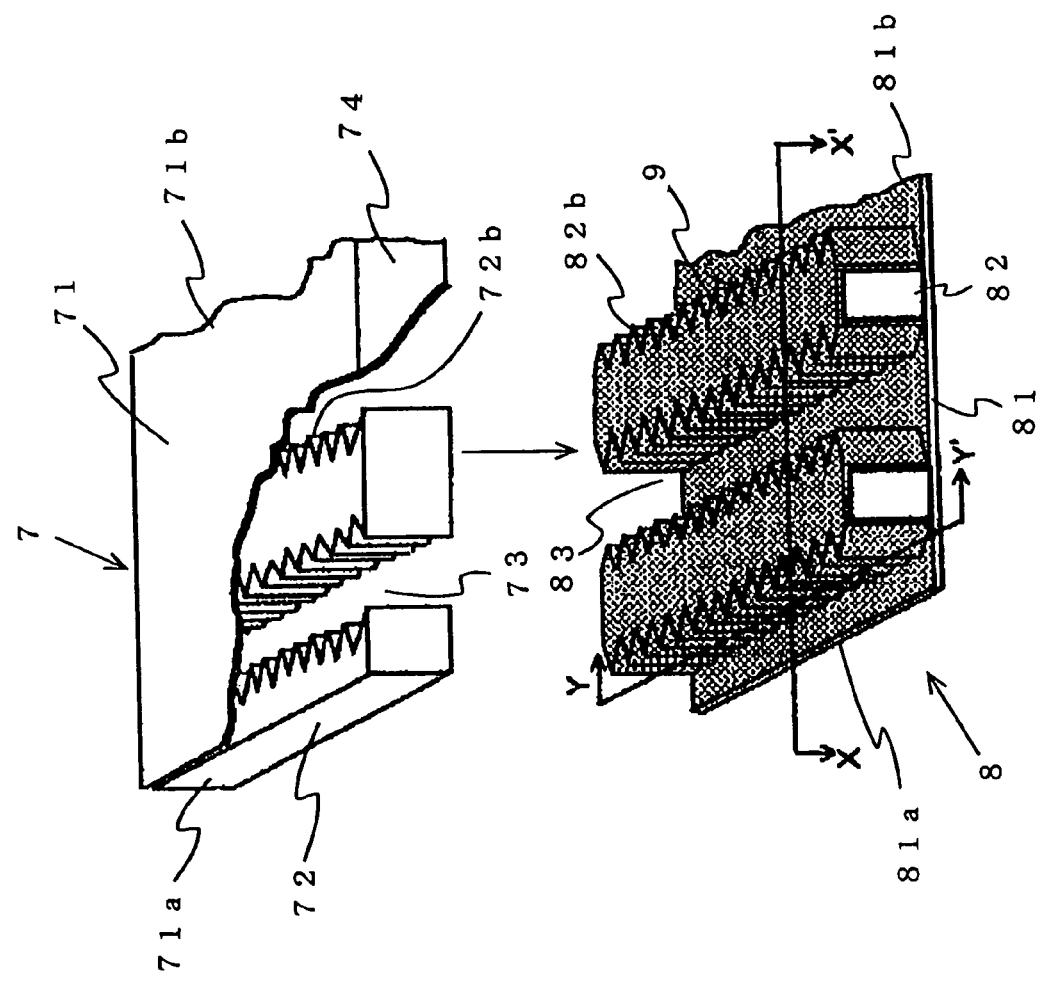
FIG. 14 is a perspective view showing a configuration of an element of parallel flat plate line type in a third embodiment according to the present invention before assembly.
Figure 16:
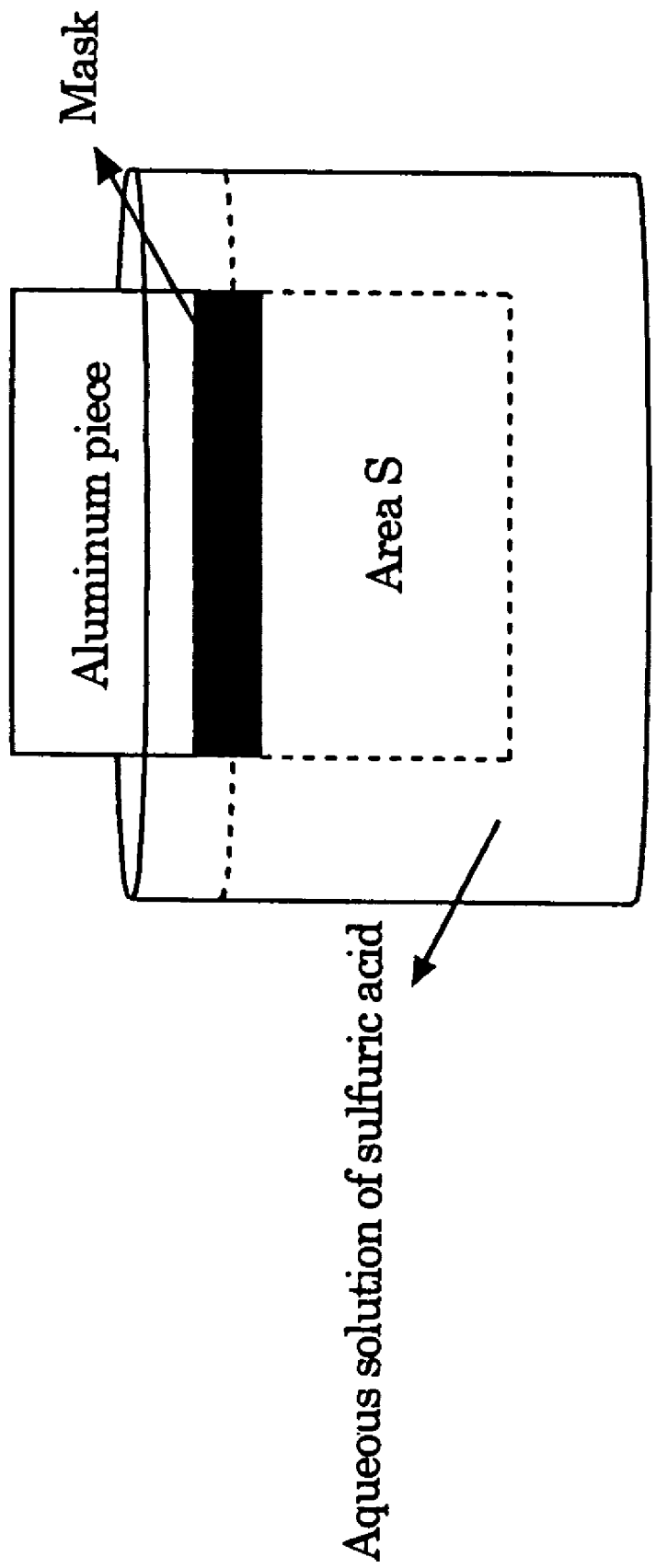
FIG. 16 is a diagram to explain a method of measuring electrostatic capacity of an aluminum piece.

Referring next to the drawings, description will be given of a third embodiment of the element of parallel flat plate line type in accordance with the present invention. FIG. 14 is a perspective view showing a configuration of an element of parallel flat plate line type in the third embodiment according to the present invention before assembly and FIG. 15 is a partial cross-sectional view of the element of parallel flat plate line type in the third embodiment according to the present invention in which (a) is a cross-sectional view (in a line direction) of a cross section X-X' of FIG. 14 and (b) is a cross-sectional view of a cross section Y-Y' of FIG. 14.

Also in the third embodiment of the present invention, the element of parallel flat plate line type includes, for example, a first metallic member 7, a second metallic member 8, and a conductive material layer 9 as shown in FIG. 14.

The first metallic member 7 includes a plurality of projected sections 72 in the shape of projections and depressions arranged to stand vertically with respect to the plate section 71 with an equal interval therebetween, and on a side surface along a longitudinal direction of the projected section 72, saw-toothed projections 72b are dispose to have a saw-toothed cross section parallel to the plate section 701. The second metallic member 8 includes metal having a function of a valve and includes a plurality of projected sections 82 in the form of projections and depressions arranged to stand vertically with respect to the plate section 81 with an equal interval therebetween, and on a side surface along a longitudinal direction of the projected section 82, saw-toothed projections 82b are dispose to have a saw-toothed cross section parallel to the plate section 81, and a dielectric film 91 is disposed on a surface of the side on which the projected sections 82 are arranged.

The first and second metallic members 7 and 8 have contours such that the projected sections 72 and 82 of the respective members engage with gap sections 83 and 73 of the associated members with a predetermined gap therebetween, and the gap is filled with a conductive material layer 9. On both end sections of the parallel flat plate sections 71 and 81 of the first and second metallic members 7 and 8 in the direction orthogonal to the projected sections 72 and 82, cathode lead terminals 71a and 71b and anode lead terminals 81a and 81b are disposed, and surfaces on both sides other than the sides on which the electrode lead terminals are disposed are covered with a side-surface shield plate 74 arranged on the first metallic member 7.

In the element of parallel flat plate line type of the third embodiment, only the contours of the projected sections 72 and 82 differ from those of the projected sections 12 and 22 of the first embodiment and hence detailed description of the element will be avoided.

Next, description will be given in detail of a production procedure of the first to third embodiments described above.

EMBODIMENT 1-1

First, description will be given of a procedure to form the first and second metallic members 1 and 2 in which a plurality of projections are disposed to stand on one-side surfaces of the plate sections (11, 21) in a direction substantially orthogonal to the surfaces. For this purpose, there can be used three methods described below. The first method is a method in which a parallel flat plate is pressed using a metallic mold to form projections and depressions. The second method is a method in which an orthogonal plate is attached as a part onto a parallel flat plate. That is, slits are formed on the parallel flat plate, and vertical plates are engaged with the slits to be fixed thereonto using silver paste or the like. Alternatively, the parallel flat plate is fixed onto the vertical plates by welding. The third method is a method in which projections and depressions are formed by etching. In this method, a metal (e.g., an aluminum piece) is covered with insulator and resist is coated to conduct patterning by use of a mask. In this method, aluminum oxide is then etched in hydrogen fluoride, and aluminum is etched in hot phosphoric acid using the aluminum oxide as a mask to thereby remove the coating aluminum oxide from the entire surfaces.

Next, in the first embodiment of the first embodying mode, anodic oxidation is conducted, for an aluminum piece on which the projected section 22 is formed, at 10 V in aqueous solution of ammonium borate in which 5 wt. % ammonium borate is dissolved in water, and the piece is washed and dried to obtain, as the second metallic member 2, an aluminum piece having an oxidized dielectric film 31 including a film of oxidized metal. Both end sections each having a length of 5 mm of the aluminum piece are soaked in solution of fluorine-based resin including hexafluoropropylene, and the piece is dried and the both ends are masked. The piece is soaked in 0.1 N sulfric acid aqueous solution, and electrostatic capacity of the piece is measured as about 380 μF. The measurement of electrostatic capacity is conducted in a state in which the piece is soaked in the sulfric acid aqueous solution as shown in FIG. 14. Since the sulfric acid aqueous solution has high electric conductivity and hence penetrates into the gaps between the dielectric films, it is possible to correctly measure electrostatic capacity proportional to an area of the dielectric film. In this situation, although it may be concerned that the sulfric acid aqueous solution takes a long response time, the measuring frequency is as low as about 120 Hz and hence the response time does not lead to any problem. Additionally, the aqueous solution is not limited to the sulfric acid aqueous solution, but may be any aqueous solution having electric conductivity.

Thereafter, aqueous solution containing paratoluensulfonic acid at a density of 10 wt. % and aniline at a density of 5 wt. % is prepared in a glass container. The aluminum piece on which the dielectric film 31 has been formed is soaked in the aqueous solution and then is removed therefrom. The aluminum piece is dried in the air for 30 minutes at room temperature to be then soaked in aqueous solution containing ammonium peroxodisulfate at a density of 10 wt. % and paratoluensulfonic acid at a density of 10 wt. %. The aluminum piece is removed from the solution to be kept in the air for 20 minutes for polymerization of aniline. The aluminum piece is then washed in water and methanol and is dried at 80° C. The operation is repeatedly conducted four times to obtain the second metallic member 2 in which the surface of the dielectric film 31 is coated with conductive polymer including polyaniline with paratoluensulfonic acid as a dopant.

Conductive carbon paste and silver paste are created to cover a portion of the aluminum piece on which conductive polymer (polyaniline) is to be formed to resultantly generate conductive material layer 3 including a conductive polymer, conductive carbon paste, and silver paste. On the layer 3, a first metallic member 1 including a copper plate having a projected section 12 is then attached to cover the layer 3. Both ends of the metallic plate 1 are formed as cathode lead terminals 11a and 11b. Thereafter, both end sections of the second metallic member 2 including an aluminum piece are soaked in tetrahydrofuran to dissolve hexafluoropropylene as a mask resin, and thereafter by using an ultrasonic welding machine, two anode lead terminals 21a and 21b are attached onto both ends of the member 2.

Capacitance of the element of parallel flat plate line type thus produced is measured using the second metallic member 2 as an anode including an aluminum piece and the first metallic member 1 as a cathode including an copper plate to obtain about 380 μF at a measuring frequency of about 120 Hz, indicating that the surface of the dielectric film 31 is sufficiently covered with polyaniline.

By connecting two sets of electrode lead terminals 11a, 11b, 21a, and 21b disposed on both ends of the element of parallel flat plate line type to a network analyzer, the power transmission characteristic S21 is measured to resultantly attain −70 dB or less in a zone ranging from 100 kHz to 100 MHz and −40 dB or less even for one gigaherz. This indicates that the element has a characteristic, as a power source decoupling element of a high-speed digital circuit, remarkably superior to that of the conventional capacitors.

EMBODIMENT 1-2

In the second embodiment of the first embodying mode, methanol solution containing iron (II) dodecylbenzenesulfonate at a density of 10 wt. % is created in a glass container and the aluminum piece of embodiment 1-1 including the dielectric film 31 formed thereon is soaked in the solution and is then removed therefrom. The aluminum piece is dried in the air for 30 minutes at room temperature to be then soaked in aqueous solution containing pyrrole at a density of 50 wt. %. The aluminum piece is removed from the solution to be kept in the air for 30 minutes for polymerization of pyrrole. The aluminum piece is then washed in water and methanol and is dried at 80° C. The operation is repeatedly conducted four times to obtain an aluminum piece 2 in which the surface of the dielectric film 31 is coated with conductive polymer of polypyrrole with dodecylbenzenesulfonate as a dopant.

Conductive material layer 3 is created in a method similar to that of embodiment 1-1 to cover a portion of the aluminum piece on which polypyrrole is to be formed, a first metallic member 1 including a copper plate and having a projected section 12 is attached, and both ends of a parallel flat plate section 11 thereof are formed as cathode lead terminals 11a and 11b. Thereafter, the mask resin is dissolved in a method similar to that of embodiment 1-1 to attach two sets of lead anode lead terminals 21a and 21b.

Capacitance of the element of parallel flat plate line type thus produced is measured using the second metallic member 2 as an anode including an aluminum piece and the first metallic member 1 as a cathode including an copper plate to obtain about 380 μF at a measuring frequency of 120 Hz. This indicates that the surface of the dielectric film 31 is sufficiently covered with conductive polymer of polypyrrole.

By connecting two sets of electrode lead terminals 11a, 11b, 21a, and 21b disposed on both ends of the element of parallel flat plate line type to a network analyzer, the power transmission characteristic S21 is measured to resultantly attain −70 dB or less in a zone ranging from 100 kHz to 100 MHz and −40 dB or less even at one gigaherz. This indicates that the element has a characteristic, as a power source decoupling element of a high-speed digital circuit, remarkably superior to that of the conventional capacitors.

EMBODIMENT 1-3

In the third embodiment of the first embodying mode, solution of polyhexylthiophene at a density of 5 wt. % is created in a glass container and is dropped on a portion not masked with the aluminum piece of embodiment 1-1 and then is dried at 80° C. Thereafter, the entire body is soaked in aqueous solution of hydrochloric acid to obtain an aluminum piece in which the surface of the dielectric film 31 is coated with the dielectric film 31 including polyhexylthiophene as conductive polymer with hydrochloric ions as a dopant.

Conductive material layer 3 is created in a method similar to that of embodiment 1-1 to cover a portion of the aluminum piece on which polyhexylthiophene is to be formed, a first metallic member 1 including a copper plate is attached, and both ends of a parallel flat plate section 11 thereof are formed as cathode lead terminals 11a and 11b. Thereafter, the mask resin is dissolved in a method similar to that of embodiment 1-1 to attach two sets of anode lead terminals 21a and 21b.

Capacitance of the element of parallel flat plate line type thus produced is measured using the second metallic member 2 as an anode including an aluminum piece and the first metallic member 1 as a cathode including a copper plate to obtain about 380 μF at a measuring frequency of 120 Hz. This indicates that the surface of the dielectric film 31 is sufficiently covered with polyhexylthiophene.

By connecting two sets of electrode lead terminals 11a, 11b, 21a, and 21b disposed on both ends of the element of parallel flat plate line type to a network analyzer, the power transmission characteristic S21 is measured to resultantly attain −60 dB or less in a zone ranging from 100 kHz to 100 MHz and −40 dB or less even at one gigaherz. This indicates that the element has a characteristic, as a power source decoupling element of a high-speed digital circuit, remarkably superior to that of the conventional capacitors.

EMBODIMENT 1-4

In the fourth embodiment of the first embodying mode, ethanol solution containing iron (II) dodecylbenzenesulfonate at a density of 10 wt. % is created in a glass container and the aluminum piece of embodiment 1-1 including the dielectric film 31 formed thereon is soaked in the solution and is then removed therefrom. The aluminum piece is dried in the air for 30 minutes at room temperature to be then soaked in aqueous solution containing ethylenedioxythiophene at a density of 50 wt. %. The aluminum piece is removed from the solution to be kept in the air for 30 minutes for polymerization of ethylenedioxythiophene. The aluminum piece is then washed in water and methanol and is dried at 80° C. The operation is repeatedly conducted four times to obtain an aluminum piece in which the surface of the dielectric film 31 is coated with conductive polymer 31 of polyethylenedioxythiophene with dodecylbenzenesulfonate as a dopant.

Conductive material layer 3 is created in a method similar to that of embodiment 1-1 to cover a portion of the aluminum piece on which polyethylenedioxythiophene is to be formed, a first metallic member 1 including a copper plate is attached, and both ends of a parallel flat plate section 11 thereof are formed as cathode lead terminals 11a and 11b. Thereafter, dissolving the mask resin in a method similar to that of embodiment 1-1, two lead anode lead terminals 21a and 21b are attached.

Capacitance of the element of parallel flat plate line type thus produced is measured using the second metallic member 2 as an anode including an aluminum piece and the first metallic member 1 as a cathode including an copper plate to obtain about 380 μF at a measuring frequency of 120 Hz. This indicates that the surface of the dielectric film 31 is sufficiently covered with polyethylenedioxythiophene.

By connecting two sets of electrode lead terminals 11a, 11b, 21a, and 21b disposed on both ends of the element of parallel flat plate line type to a network analyzer, the power transmission characteristic S21 is measured to resultantly attain −60 dB or less in a zone ranging from 1 MHz to 100 MHz and −40 dB or less even at one gigaherz. This indicates that the element has a characteristic, as a power source decoupling element of a high-speed digital circuit, remarkably superior to that of the conventional capacitors.

EMBODIMENT 1-5

In the fifth embodiment of the first embodying mode, methanol solution containing iron (II) dodecylbenzenesulfonate at a density of 30 wt. % is filled in a glass container to be cooled down to −50° C. Next, pyrrole is dropped in the solution at a density of 6 wt. % and is mixed by stirring while the solution is kept at −50° C. The solution is dropped onto an unmasked portion of the aluminum piece on which the dielectric film 31 of the embodiment 1-1 is formed and the aluminum portion is kept for 60 minutes at the room temperature. The aluminum piece is then washed in water and methanol and is dried at 80° C. to obtain an aluminum piece in which the surface of the dielectric film 31 is coated with conductive polymer 31 of polypyrrole with dodecylbenzenesulfonate as a dopant.

Conductive material layer 3 is created in a method similar to that of embodiment 1-1 to cover a portion of the aluminum piece on which polypyrrole is to be formed, a first metallic member 1 including a copper plate is attached, and both ends of a flat section 11 thereof are formed as cathode lead terminals 11a and 11b. Thereafter, after dissolving the mask resin in a method similar to that of embodiment 1-1, two sets of anode lead terminals 21a and 21b are attached.

Capacitance of the element of parallel flat plate line type thus produced is measured using the second metallic member 2 as an anode including an aluminum piece and the first metallic member 1 as a cathode including an copper plate to obtain about 375 μF at a measuring frequency of 120 Hz. This indicates that the surface of the dielectric film 31 is sufficiently covered with polypyrrole.

By connecting two sets of electrode lead terminals 11a, 11b, 21a, and 21b disposed on both ends of the element of parallel flat plate line type to a network analyzer, the power transmission characteristic S21 is measured to resultantly attain −60 dB or less in a zone ranging from 1 MHz to 100 MHz. This indicates that the element has a characteristic, as a power source decoupling element of a high-speed digital circuit, remarkably superior to that of the conventional capacitors.

EMBODIMENT 1-6

In the sixth embodiment of the first embodying mode, tantalum powder having a mean particle diameter of 0.5 μm is filled in a space having a contour of projections and depressions, and a tantalum plate is attached onto a flat surface thereof to conduct pressure forming. A molded body thus molded is heated in vacuum up to 2000° C. to obtain a second metallic member 2 including a molded body of sintered tantalum powder. In aqueous solution of phosphoric acid at 0.05 wt. %, anodic oxidation is performed at a forming voltage of 10 V for the second metallic member 2. By washing and drying the member 2, there is obtained a molded body of tantalum including a dielectric film 31 including a film of oxidized metal. A tantalum line portion of the molded body is soaked in solution of fluorine based resin including hexafluoropropylene, and the portion is dried and is then masked. The obtained molded body is soaked in 0.1N sulfric acid aqueous solution, and electrostatic capacitance thereof is measured to obtain about 300 μF at a measuring frequency of 120 Hz.

Next, methanol solution containing iron (II) dodecylbenzenesulfonate at a density of 10 wt. % is created in a glass container, and the molded body of tantalum fine powder including a dielectric film 31 is soaked in the solution and is then removed therefrom. The molded body is dried in the air for 30 minutes at room temperature to be then soaked in aqueous solution including pyrrole at 50 wt. %. The molded body is removed and is kept in the air further for 30 minutes for polymerization of pyrrole. Thereafter, the molded body is washed in water and methanol and is dried at 80° C. This operation is repeatedly conducted four times to obtain a molded body of tantalum fine powder in which the surface of the dielectric film 31 is coated with conductive polymer of polypyrrole where dodecylbenzenesulfonic acid acts as a dopant.

Conductive material layer 3 is created in a method similar to that of embodiment 1-1 to cover a portion of the molded body of tantalum fine powder on which polypyrrole is to be formed, a first metallic member 1 including a metallic plate of copper is attached, and both ends of a flat plate section 11 thereof are formed as cathode lead terminals 11*a* and 11*b*. Thereafter, after dissolving the mask resin in a method similar to that of embodiment 1-1, two sets of anode lead terminals 21*a* and 21*b* are attached.

Capacitance of the element of parallel flat plate line type thus produced is measured using the second metallic member 2 as an anode including metal of tantalum fine powder and the first metallic member 1 as a cathode including a metallic plate of copper to obtain about 280 μF at a measuring frequency of 120 Hz. This indicates that the surface of the dielectric film 31 is sufficiently covered with polypyrrole.

By connecting two sets of electrode lead terminals 11*a*, 11*b*, 21*a*, and 21*b* disposed on both ends of the element of parallel flat plate line type to a network analyzer, the power transmission characteristic S21 is measured to resultantly attain about −60 dB or less in a zone ranging from 100 kHz to 100 MHz and −40 dB or less even at one gigaherz. This indicates that the element has a characteristic, as a power source decoupling element of a high-speed digital circuit, remarkably superior to that of the conventional capacitors.

EMBODIMENT 2-1

In the first embodiment of the second embodying mode, the second metallic member 5 is formed such that the contour of the projected section 52 includes an array of poles each having a cross-shaped cross section. For an aluminum piece of which both ends are formed as anode lead terminals 51*a* and 51*b*, anodic oxidation is performed at 10 V in aqueous solution of ammonium borate at 5 wt. %, and the aluminum piece is washed and dried to obtain as the second metallic member 5 including an aluminum piece having an oxidized dielectric film 61 including a film of oxidized metal. Both end sections each being 5 mm of the aluminum piece are soaked in solution of fluorine-based resin including hexafluoropropylene, and the piece is dried and the both ends are masked.

Subsequently, aqueous solution containing paratoluensulfonic acid at a density of 10 wt. % and aniline at a density of 5 wt. % is prepared in a glass container. The second metallic member 5 including an aluminum piece on which the dielectric film 31 has been formed is soaked in the aqueous solution and is then removed therefrom. The aluminum piece is dried in the air for 30 minutes at room temperature to be then soaked in aqueous solution containing ammonium peroxodisulfate at 10 wt. % and paratoluensulfonic acid at 10 wt. %. The aluminum piece is removed from the solution to be kept in the air for 20 minutes for polymerization of aniline. The aluminum piece is then washed in water and methanol and is dried at 80° C. The operation is repeatedly conducted four times to obtain the second metallic member 2 including the aluminum piece in which the surface of the dielectric is coated with conductive polymer of polyaniline where paratoluensulfonic acid acts as a dopant.

A layer of conductive material 6 including conductive carbon paste and silver paste is created to cover a portion of the second metallic member 5 including the aluminum piece on which polyaniline is to be formed, and then a first metallic member 4 including a metallic plate of copper having a thickness of about 100 μm is attached to cover the portion of the second metallic member 5 including the aluminum piece on which polyaniline is to be formed, and screw holes are disposed on both ends thereof to form cathode lead terminals 41*a* and 41*b*. Thereafter, both end sections of the second metallic member 5 including the aluminum piece 2 are soaked in tetrahydrofuran to dissolve mask resin of hexafluoropropylene.

Capacitance of the element of parallel flat plate line type thus produced is measured using the second metallic member 5 including the aluminum piece 2 as an anode including an aluminum piece and the first metallic member 4 as a cathode including a metallic plate of copper to obtain about 310 μF at a measuring frequency of 120 Hz.

By connecting two sets of electrode lead terminals 41*a*, 41*b*, 51*a*, and 51*b* disposed on both ends of the element of parallel flat plate line type to a network analyzer, the power transmission characteristic S21 is measured to resultantly attain −40 dB or less in a zone ranging from 100 kHz to 1 GHz. This indicates that the element has a characteristic, as a power source decoupling element of a high-speed digital circuit, remarkably superior to that of the conventional capacitors.

Incidentally, embodiments 1-2 to 1-6 which are production procedures of the first embodying mode described above are also similarly applicable also to the second embodying mode.

EMBODIMENT 3-1

In the first embodiment of the third embodying mode, the second metallic member 8 is formed such that the contour of the projected section 82 has a contour of an array of saw-toothed poles. For an aluminum piece of which both ends are formed as anode lead terminals 81*a* and 81*b*, anodic oxidation is performed at 10 V in aqueous solution of ammonium borate at 5 wt. %, and the aluminum piece is washed and dried to obtain the second metallic member 8 including an aluminum piece having an oxidized dielectric film 91 including a film of oxidized metal. Both end sections of the flat section 81 of the second metallic member 8 are soaked by 5 mm in solution of fluorine-based resin including hexafluoropropylene, and the piece is dried and the both ends are masked.

Next, aqueous solution containing paratoluensulfonic acid at a density of 10 wt. % and aniline at a density of 5 wt. % is prepared in a glass container. The aluminum piece on which the dielectric film 91 has been formed is soaked in the aqueous solution and is then removed therefrom. The aluminum piece is dried in the air for 30 minutes at room temperature to be then soaked in aqueous solution containing ammonium peroxodisulfate at 10 wt. % and paratoluensulfonic acid at 10 wt. %. The aluminum piece is removed from the solution to be kept in the air for 20 minutes for polymerization of aniline. The aluminum piece is then washed in water and methanol and is dried at 80° C. The operation is repeatedly conducted four times to obtain the second metallic member 8 including the aluminum piece in which the surface of the dielectric is coated with conductive polymer of polyaniline where paratoluensulfonic acid acts as a dopant.

A conductive material layer 9 including conductive carbon paste and silver paste is created to cover a portion of the second metallic member 8 including the aluminum piece on which polyaniline is to be formed, and then a first metallic member 7 including a metallic plate of copper having a width of about 100 μm is attached to cover the portion of the second metallic member 8 on which polyaniline is to be formed, and screw holes are disposed on both ends thereof to form cathode lead terminals 81*a* and 81*b*. Thereafter, both end sections of the flat section 81 of the second metallic member 8 are soaked in tetrahydrofuran to dissolve mask resin of hexafluoropropylene.

Capacitance of the element of parallel flat plate line type thus produced is measured using the second metallic member 2 including the aluminum piece as an anode including an aluminum piece and the first metallic member 1 as a cathode including an copper plate to obtain about 310 µF at a measuring frequency of 120 Hz.

By connecting two sets of electrode lead terminals 71a, 71b, 81a, and 81b disposed on both ends of the element of parallel flat plate line type to a network analyzer, the power transmission characteristic S21 is measured to resultantly attain −40 dB or less in a zone ranging from 100 kHz to 1 GHz. This indicates that the element has a characteristic, as a power source decoupling element of a high-speed digital circuit, remarkably superior to that of the conventional capacitors.

Incidentally, embodiments 1-2 to 1-6 which are production procedures of the first embodying mode described above are also similarly applicable also to the third embodying mode.

Next, referring to FIG. 17, description will be given of a circuit board in which the element of parallel flat plate line type of the first embodying mode described above is mounted on a laminated printed circuit board.

The circuit board shown in FIG. 15 includes a laminated printed circuit board 303, an element of parallel flat plate line type mounted on a surface of the board 303, power source wiring 301a and 301b to be respectively connected to anode lead terminals 21a and 21b of the element, and ground wiring 302a and 302b to be respectively connected to cathode lead terminals 11a and 11b of the element. The wiring 301a, 301b, 302a, and 302b are respectively formed on the board 303 using a material having high electric conductivity such as copper.

On the laminated printed circuit board 303, there are mounted a large number of circuit elements, not shown. There exists a problem that high-frequency noise occurring from these circuit elements is combined with the power source wiring 301a and 301b and the ground wiring 302a and 302b to propagate through the wiring to cause a wrong operation in the circuit elements. However, the circuit board shown in FIG. 15 has a feature in which by filtering the noise in the element of parallel flat plate line type, it does not easily occur that the circuit board conducts a wrong operation for the high-frequency noise, and hence the circuit board conducts a stable circuit operation for high frequencies.

Moreover, when a large number of circuit elements are mounted on the circuit board, the elements are arranged in the proximity of each other, and hence the noise sources are in the vicinity of the circuit elements which are affected by the noise sources. Also in this case, the element of parallel flat plate line type inserted between the power source wiring and the ground wiring efficiently filters the noise combined with the power source wiring and the ground wiring, and hence the circuit board using the element of parallel flat plate line type of the invention of the present application can be used to mount thereon circuit boards operating with high frequencies densely.

Incidentally, although the wiring to be paired with the power source wiring is the ground wiring in the description, the wiring may be negative power source wiring. In general, first dc power source wiring and second dc power source wiring are connected respectively to the anode lead terminals 21a and 21b and the cathode lead terminals 11a and 11b of the element of parallel flat plate line type to thereby construct the whole circuit.

Figure 17:
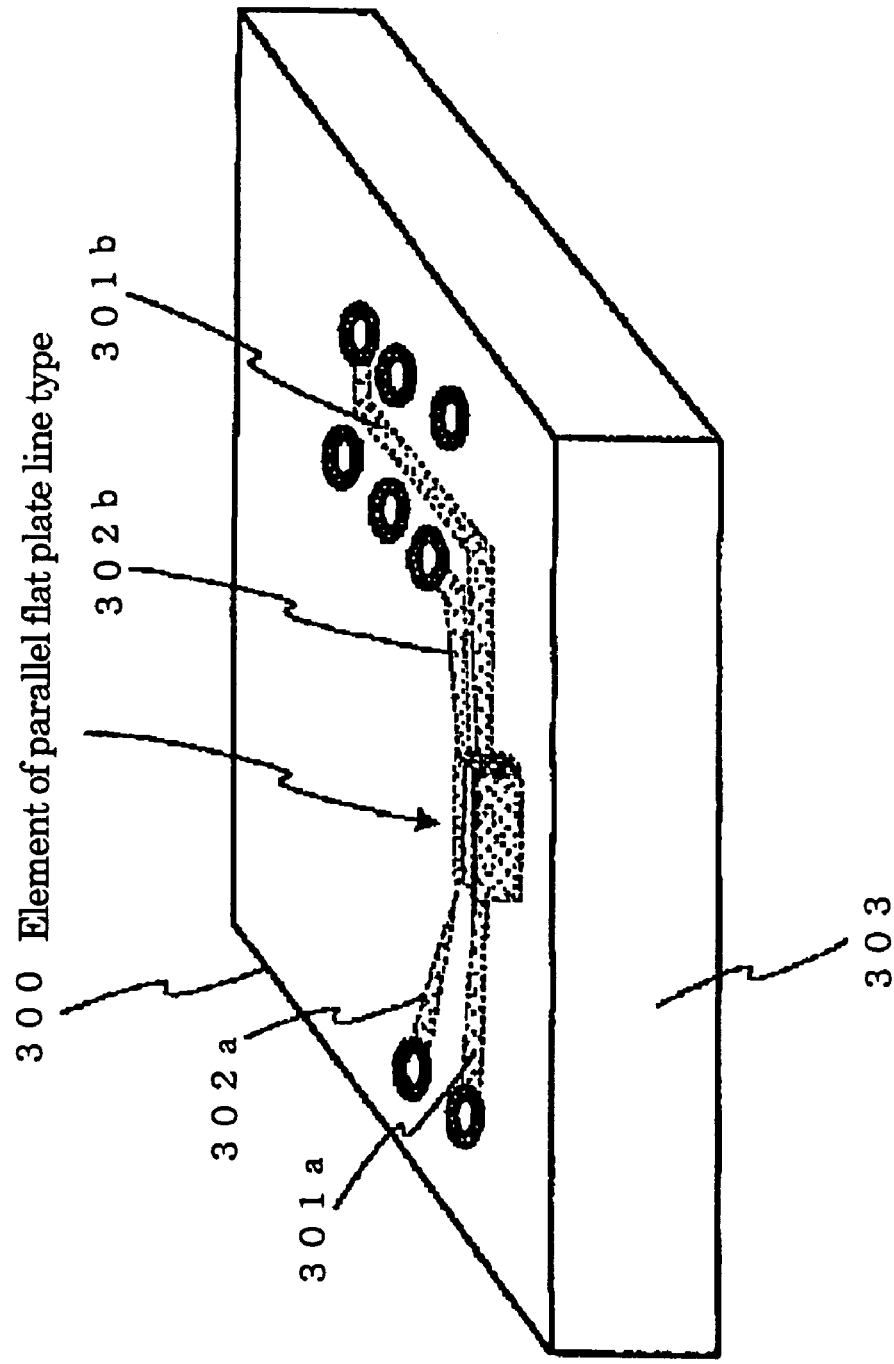
FIG. 17 is a perspective view in which a circuit board is configured by mounting an element of parallel flat plate line type in accordance with the present invention on a printed circuit board.

Furthermore, in conjunction with FIG. 17 and the configuration described above, description has been given of a case in which the element of parallel flat plate line type is mounted on a surface of the laminated printed circuit board 303. However, a similar advantage is obtained also by mounting the element of parallel flat plate line type of the present invention on a surface of an inner substrate inside the multi-layer board constituting the laminated printed circuit board 303. Additionally, in the description of the embodying mode of the circuit board, the element of parallel flat plate line type of the first embodying mode described above is mounted. However, the second and third embodying modes of the element of parallel flat plate line type can also be similarly applied to the circuit board.

The embodying modes described above is favorable embodying modes of the present invention. However, the present invention is not restricted by the embodying modes, but can be changed or modified in various ways without departing from the scope and spirit of the present invention.

INDUSTRIAL APPLICABILITY

As described above, in accordance with the present invention, an element of parallel flat plate line type is configured such that for a high-frequency electromagnetic wave ranging from 100 kHz to 10 GHz which is supplied from an input terminal of a transmission line of the element and which is delivered to an output terminal thereof, the transmission line has transmittivity ranging from −140 dB to −20 dB. Therefore, it is possible to design the element of parallel flat plate line type to have sufficiently low characteristic impedance, and hence the electromagnetic wave occurring from the noise sources can be prevented from entering the power distributing circuit side.

Also, there is configured the element of parallel flat plate line type which is one of the transmission line configurations, and hence frequency dependence of the characteristic impedance of the line decreases; and the line is constructed in the contour of projections and depressions, and hence a one-layer line is elongated for a high frequency for which power is concentrated on a metallic surface. Therefore, a high-frequency electromagnetic wave supplied from one side of metal having a valve function is filtered in a wide frequency band by the thin film of the dielectric film and the conductive material, and hence there can be implemented a line-type element suitable for a higher speed and a higher frequency.

When the conductive material layer includes conductive polymer, it is possible to easily obtain an element of parallel flat plate line type usable up to a high-frequency range. When the conductive polymer is either one of polypyrrole, polyaniline, and derivatives thereof, it is possible to form a layer of a conductive material superior in the environmental stability and stable up to 100 degree centigrade or more, and hence it is possible to easily obtain an element of parallel flat plate line type superior in stability and durability and usable up to a high-frequency range.

Moreover, when the metal having a valve function to configure the first or second metallic member is aluminum, tantalum, or niobium, it is possible to form a uniform and stable dielectric film having a high dielectric constant, and hence it is possible to easily obtain a stable element of parallel flat plate line type superior in high volume efficiency.

The invention claimed is:
1. An element of parallel flat plate line type comprising:
a first metallic member including a first flat plate section and a projected section in which a plurality of projections are formed to stand on a surface of the first flat plate section in a direction substantially vertical to the surface with gaps therebetween;
a second metallic member including a second flat plate section and a projected section in which a plurality of projections are formed to stand on a surface of the second flat plate section in a direction substantially vertical to the surface with gaps therebetween; and
a dielectric film,
wherein the first metallic member and the second metallic member are disposed such that the projections of the first metallic member are positioned in the gaps of the second metallic member and the projections of the second metallic member are positioned in the gaps of the first metallic member and the dielectric film is disposed between the first metallic member and the second metallic member,
wherein a transmission line is formed between the first metallic member and the second metallic members along the dielectric film,
the transmission line being formed such that for a high-frequency electromagnetic wave ranging from 100 kHz to 10 GHz which is supplied from an input terminal of the transmission line and is delivered to an output terminal thereof, the transmission line has transmittivity ranging from −140 dB to −20 dB.

2. An element of parallel flat plate line type as claimed in claim 1,
wherein:
the projected section of the first metallic member and the projected section of the second metallic member have a contour of a flat plate.

3. An element of parallel flat plate line type as claimed in claim 1, wherein:
the projected section of the first metallic member has a contour of a projected and recessed plate and includes a standing flat plate section and a plurality of prism sections disposed on a surface of the standing flat plate section with a predetermined gap therebetween in a direction vertical to the first flat plate section;
the projected section of the second metallic member has a contour of a projected and recessed plate and includes a standing flat plate section and a plurality of prism sections disposed on a surface of the standing flat plate section with a predetermined gap therebetween in a direction vertical to the second flat plate section.

4. An element of parallel flat plate line type as claimed in claim 1, wherein a conductive material layer including a conductive material is filled in a space between the dielectric film and at least one of the first metallic member and the second metallic member.

5. An element of parallel flat plate line type as claimed in claim 1, further comprising a side-surface shield plate disposed on a side surface of each of the first plate section and second flat plate section to prevent outward leakage of an electromagnetic wave.

6. An element of parallel flat plate line type as claimed in claim 1, wherein:
the second metallic member includes metal having a valve function; and
the dielectric film is formed on a surface of the metal having a valve function.

7. An element of parallel flat plate line type comprising:
a first metallic member including a first flat plate section and a projected section in which a plurality of projections are formed to stand on one surface of the first flat plate section in a direction substantially vertical to the surface with gaps therebetween;
a second metallic member including a second flat plate section and a projected section in which a plurality of projections are formed to stand on one surface of the second flat plate section in a direction substantially vertical to the surface with gaps therebetween; and
a dielectric film formed between the projections and the gaps of the element of parallel flat plate line type formed by inserting the projections of the first metallic member in the gap of the second metallic member and inserting the projections of the second metallic member in the gap of the first metallic member, wherein a transmission line is formed between the first and second metallic members along the dielectric film,
the transmission line being formed such that for a high-frequency electromagnetic wave ranging from 100 kHz to 10 GHz which is supplied from an input terminal of the transmission line and is delivered to an output terminal thereof, the transmission line has transmittivity ranging from −140 dB to −20 dB,
wherein, projected section of the first metallic member has a contour of a projected and recessed plate in which saw-toothed projections are disposed on a side surface of the projected section, the saw-toothed projection having a cross section in a contour of a saw tooth parallel to the first flat plate section; and
the projected section of the second metallic member has a contour of a projected and recessed plate in which saw-toothed projections are disposed on a side surface of the projected section, the saw-toothed projection having a cross section in a contour of a saw tooth parallel to the second flat plate section.

8. An element of parallel flat plate line type comprising:
a first metallic member including a first flat plate section and a projected section in which a plurality of projections are formed to stand on one surface of the first flat plate section in a direction substantially vertical to the surface with gaps therebetween;
a second metallic member including a second flat plate section and a projected section in which a plurality of projections are formed to stand on one surface of the second flat plate section in a direction substantially vertical to the surface with gaps therebetween; and
a dielectric film formed between the projections and the gaps of the element of parallel flat plate line type formed by inserting the projections of the first metallic member in the gap of the second metallic member and inserting the projections of the second metallic member in the gap of the first metallic member, wherein a transmission line is formed between the first and second metallic members along the dielectric film,
the transmission line being formed such that for a high-frequency electromagnetic wave ranging from 100 kHz to 10 GHz which is supplied from an input terminal of the transmission line and is delivered to an output terminal thereof, the transmission line has transmittivity ranging from −140 dB to −20 dB.
wherein input dc power is transmitted along the first metallic member and the second metallic member.

9. An element of parallel flat plate line type comprising:
a first metallic member including a first flat plate section and a projected section in which a plurality of projections are formed to stand on one surface of the first flat plate section in a direction substantially vertical to the surface with gaps therebetween;

a second metallic member including a second flat plate section and a projected section in which a plurality of projections are formed to stand on one surface of the second flat plate section in a direction substantially vertical to the surface with gaps therebetweew and a dielectric film formed between the projections and the gaps of the element of parallel flat plate line type formed by inserting the projections of the first metallic member in the gap of the second metallic member and inserting the projections of the second metallic member in the gap of the first metallic member, wherein a transmission line is formed between the first and second metallic members along the dielectric film, the transmission line being formed such that for a highfreciuency electromagnetic wave ranging from 100 kHz to 10 GHz which is supplied from an input terminal of the transmission line and is delivered to an output terminal thereof, the transmission line has transmittivity ranging from −140 dB to −20 dB, wherein, the first metallic member or the second metallic member includes metal having a valve function; and the dielectric film is formed on a surface of the metal having a valve function.

10. An element of parallel flat plate line type in accordance with claim 9, wherein the metal having a valve function is aluminum, tantalum, or niobium.

11. An element of parallel flat plate line type comprising:

a first metallic member including a first flat plate section and a projected section in which a plurality of projections are formed to stand on one surface of the first flat plate section in a direction substantially vertical to the surface with gaps therebetween;

a second metallic member including a second flat plate section and a projected section in which a plurality of projections are formed to stand on one surface of the second flat plate section in a direction substantially vertical to the surface with gaps therebetween; and a dielectric film formed between the projections and the gaps of the element of parallel flat plate line type formed by inserting the projections of the first metallic member in the gap of the second metallic member and inserting the projections of the second metallic member in the gap of the first metallic member, wherein a transmission line is formed between the first and second metallic members along the dielectric film, the transmission line being formed such that for a highfreciuency electromagnetic wave ranging from 100 kHz to 10 GHz which is supplied from an input terminal of the transmission line and is delivered to an output terminal thereof, the transmission line has transmittivity ranging from −140 dB to −20 dB, wherein a conductive material layer is selected from a group including polypyrrole, polythiephene, polvaniline, and derivatives thereof, wherein the conductive material layer includes conductive polymer.

12. An element of parallel flat plate line type in accordance with claim 11, wherein the conductive material layer is either one selected from a group including polypyrrole, polythiephene, polyaniline, and derivatives thereof.

13. A circuit board, comprising:

an element of parallel flat plate line type comprising:

a first metallic member including a plurality of first projected sections disposed to stand on a first flat plate section to be substantially parallel to each other with a gap section therebetween, both end sections of the first flat plate section being first terminals;

a second metallic member including a plurality of second projected sections disposed to stand on a second flat plate section to be substantially parallel to each other with a gap section therebetween, both end sections of the second flat plate section being first terminals; and a dielectric film formed on a surface of at least one of the first metallic member and the second metallic member on a side on which the corresponding first projected sections and second projection sections are disposed; and a transmission path formed along the dielectric film;

a substrate; and first power source wiring and second power source wiring formed on the substrate, wherein:

both end sections of the first flat plate section and both end sections of the second flat plate section are respectively inserted in to be connected to the first power source wiring and the second power source wiring; and the transmission line is formed such that for a highfrequency electromagnetic wave ranging from 100 kHz to 10 GHz which is supplied from an input terminal of the transmission line and which is delivered to an output terminal thereof, the transmission line has transmittivity ranging from −140 dB to −20 dB.

* * * * *

UNITED STATES PATENT AND TRADEMARK OFFICE
CERTIFICATE OF CORRECTION

PATENT NO. : 7,242,265 B2  Page 1 of 1
APPLICATION NO. : 11/320594
DATED : July 10, 2007
INVENTOR(S) : Koichiro Masuda It is certified that error appears in the above-identified patent and that said Letters Patent is hereby corrected as shown below:

On the face of the patent, please insert the priority data: -- This application is a CIP of PCT/JP2003/009686 --

Claim 9, col. 25, line 7, delete "therebetweew", insert -- therebetween --

Signed and Sealed this

Twenty-first Day of October, 2008

JON W. DUDAS
*Director of the United States Patent and Trademark Office*